(12) United States Patent
Shichi et al.

(10) Patent No.: US 8,658,508 B2
(45) Date of Patent: *Feb. 25, 2014

(54) METHOD FOR MANUFACTURING SOI SUBSTRATE

(75) Inventors: Takeshi Shichi, Atsugi (JP); Junichi Koezuka, Atsugi (JP); Hideto Ohnuma, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/411,864

(22) Filed: Mar. 5, 2012

(65) Prior Publication Data

US 2012/0164817 A1 Jun. 28, 2012

Related U.S. Application Data

(63) Continuation of application No. 12/567,993, filed on Sep. 28, 2009, now Pat. No. 8,143,134.

(30) Foreign Application Priority Data

Oct. 3, 2008 (JP) .................................. 2008-258290
Oct. 3, 2008 (JP) .................................. 2008-258301

(51) Int. Cl.
*H01L 21/33* (2006.01)
*H01L 21/8222* (2006.01)

(52) U.S. Cl.
USPC .... 438/311; 438/510; 438/514; 257/E21.051; 257/E21.17; 257/E21.32; 257/E21.267; 257/E21.319; 257/E21.547; 257/E21.561

(58) Field of Classification Search
USPC ......... 438/311, 510, 514, 475, 474, 509, 513; 257/E21.051, E21.17, E21.32, 257/E21.267, E21.319, E21.547, E21.561
See application file for complete search history.

(56) References Cited

U.S. PATENT DOCUMENTS

| | | | |
|---|---|---|---|
| 6,372,609 B1 | 4/2002 | Aga et al. | |
| 6,534,380 B1 | 3/2003 | Yamauchi et al. | |
| 6,582,999 B2 | 6/2003 | Henley et al. | |
| 6,717,213 B2 | 4/2004 | Doyle et al. | |
| 6,818,921 B2 | 11/2004 | Yasukawa | |

(Continued)

FOREIGN PATENT DOCUMENTS

| | | |
|---|---|---|
| EP | 1045448 A1 | 10/2000 |
| JP | 06-163446 A | 6/1994 |

(Continued)

*Primary Examiner* — David Nhu
(74) *Attorney, Agent, or Firm* — Eric J. Robinson; Robinson Intellectual Property Law Office, P.C.

(57) ABSTRACT

The present invention provides a method for manufacturing an SOI substrate, to improve planarity of a surface of a single crystal semiconductor layer after separation by favorably separating a single crystal semiconductor substrate even in the case where a non-mass-separation type ion irradiation method is used, and to improve planarity of a surface of a single crystal semiconductor layer after separation as well as to improve throughput. The method includes the steps of irradiating a single crystal semiconductor substrate with accelerated ions by an ion doping method while the single crystal semiconductor substrate is cooled to form an embrittled region in the single crystal semiconductor substrate; bonding the single crystal semiconductor substrate and a base substrate with an insulating layer interposed therebetween; and separating the single crystal semiconductor substrate along the embrittled region to form a single crystal semiconductor layer over the base substrate with the insulating layer interposed therebetween.

21 Claims, 12 Drawing Sheets

(56) References Cited

U.S. PATENT DOCUMENTS

| | | |
|---|---|---|
| 7,119,365 B2 | 10/2006 | Takafuji et al. |
| 7,148,124 B1 | 12/2006 | Usenko |
| 8,143,134 B2 * | 3/2012 | Shichi et al. ............... 438/311 |
| 2007/0063281 A1 | 3/2007 | Takafuji et al. |

FOREIGN PATENT DOCUMENTS

| | | |
|---|---|---|
| JP | 08-227685 A | 9/1996 |
| JP | 08-255762 A | 10/1996 |
| JP | 09-073873 A | 3/1997 |
| JP | 09-082267 A | 3/1997 |
| JP | 09-082661 A | 3/1997 |
| JP | 09-129895 A | 5/1997 |
| JP | 10-064471 A | 3/1998 |
| JP | 2000-124092 A | 4/2000 |
| JP | 2001-274368 A | 10/2001 |
| JP | 2004-087606 A | 3/2004 |
| WO | WO-2007/142852 | 12/2007 |

* cited by examiner

FIG. 3A-1
FIG. 3B-1
FIG. 3A-2
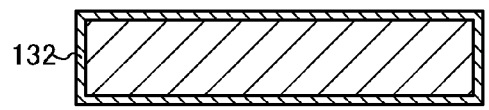
FIG. 3B-2
FIG. 3A-3
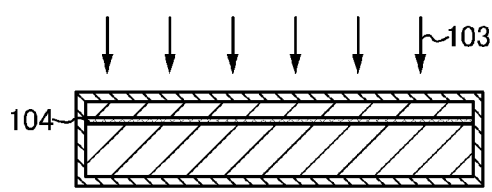
FIG. 3C
FIG. 3D
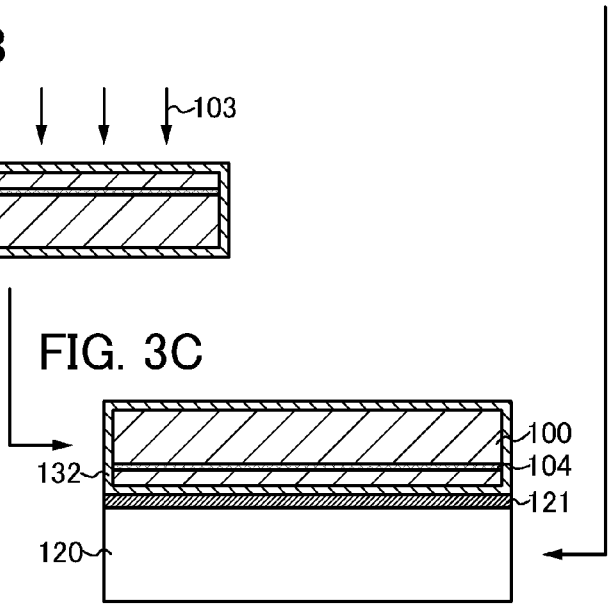
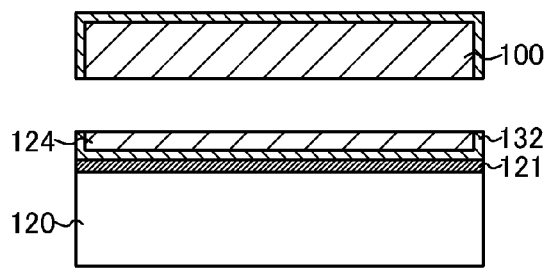

| Sample No. | peak depth [nm] | peak concentration [atoms/cm3] |
|---|---|---|
| 2.0E16cm-2 × 1 | 204.42 | 2.46E+21 |
| 1.0E16cm-2 × 2 | 204.51 | 2.49E+21 |
| 5.0E15cm-2 × 4 | 210.24 | 2.81E+21 |
| 2.5E15cm-2 × 8 | 223.85 | 3.17E+21 |

METHOD FOR MANUFACTURING SOI SUBSTRATE

This application is a continuation of application Ser. No. 12/567,993 filed on Sep. 28, 2009, now issued as U.S. Pat. No. 8,143,134.

BACKGROUND OF THE INVENTION

1. Field of the Invention

The present invention relates to a method for manufacturing a substrate over which a semiconductor layer is provided with an insulating film interposed therebetween. In particular, the present invention relates to a method for manufacturing an SOI (silicon on insulator) substrate. In addition, the present invention relates to a method for manufacturing a semiconductor device using a substrate over which a semiconductor layer is provided with an insulating film interposed therebetween.

2. Description of the Related Art

In recent years, an integrated circuit using an SOI (silicon on insulator) substrate in which a thin single crystal semiconductor layer is formed on an insulating surface, instead of a bulk silicon wafer has been developed. Since parasitic capacitance between a drain of a transistor and a substrate is reduced by using the SOI substrate, the SOI substrate has attracted attention as one improving performance of semiconductor integrated circuits.

One of known methods for manufacturing SOI substrates is a hydrogen ion implantation separation method (for example, see Patent Document 1). A method for manufacturing an SOI substrate using a hydrogen ion implantation separation method is briefly described below. First, hydrogen ions are implanted into a silicon wafer by an ion implantation method to form a microbubble layer at a predetermined depth from the surface. Then, the silicon wafer into which the hydrogen ions are implanted is bonded to another silicon wafer with a silicon oxide film interposed therebetween. Then, by heat treatment, the microbubble layer serves as a cleavage plane and a part of the silicon wafer into which hydrogen ions have been implanted is separated in a thin film shape along the microbubble layer. Accordingly, a single crystal silicon film can be formed over the other bonded silicon wafer.

A method for forming a single crystal silicon layer over a base substrate made of glass by using such a hydrogen ion implantation method as described above has been proposed (for example, see Patent Document 2). Since a glass substrate can easily have a larger area and is less expensive than a silicon wafer, when a glass substrate is used as a base substrate, an inexpensive large-area SOI substrate can be manufactured.

Further, as the area of the SOI substrate is increased, improvement in productivity becomes an important object. In manufacturing an SOI substrate, cost reduction by improvement in productivity or the like is important because a single crystal silicon substrate used is expensive.

CITATION LIST

Patent Document

[Patent Document 1] Japanese Published Patent Application No. 2000-124092
[Patent Document 2] Japanese Published Patent Application No. 2004-87606

SUMMARY OF THE INVENTION

However, in the above hydrogen ion implantation separation method, since a mass-separation type ion irradiation method (an ion implantation method) by which a silicon wafer is irradiated with ions which are generated from a source gas and are subjected to mass separation, a range of an area in which the silicon wafer is irradiated with the ions is small and it is difficult to shorten processing time. In particular, as the silicon wafer is increased, a problem of processing time becomes remarkable. Therefore, in order to improve throughput, it is effective to use a non-mass-separation type ion irradiation method (an ion doping method) by which a silicon wafer is irradiated with ions which are generated from a source gas and are not subjected to mass separation.

On the other hand, in the case where a non-mass-separation type ion irradiation method is used, although throughput is significantly improved as compared to the case where a mass-separation type ion irradiation method is used, a problem arises in that temperature increase is larger in accordance with ion irradiation as compared to the case where an ion implantation method is used because a large area of a substrate can be irradiated at a time. Such temperature increase of the substrate promotes thermal diffusion of an element derived from added ions in the substrate and becomes a factor which broadens distribution of the ions in a depth direction. In addition, the temperature increase of the substrate promotes desorption of the element derived from the ions added to and existing in the substrate.

An ion doping apparatus includes a chamber in which an object to be processed is disposed, an ion source for generating desired ions, and an extraction acceleration mechanism for acceleration of ions and for irradiation therewith. Electrodes that are included in the extraction acceleration mechanism are provided with a plurality of openings or slits, through which ions that are generated from the ion source are accelerated. Therefore, a problem arises in that a single crystal semiconductor substrate is not uniformly irradiated with the ions. In this case, temperature increase locally occurs in the single crystal semiconductor substrate, and thermal diffusion of an element derived from the added ions also locally occurs; therefore, distribution of the element in a depth direction is broadened, and becomes uneven in a horizontal direction.

As described above, if the distribution of the element derived from the added ions is broadened, it is difficult to separate the semiconductor substrate favorably. This is because the separation of the semiconductor substrate is caused in regions at a plurality of depths. Further, since the separation of the semiconductor substrate depends on the concentration of the element derived from the ions added to and existing in the semiconductor substrate, if the desorption of the element is promoted, as a result, the semiconductor substrate needs to be irradiated with more ions. Thus, throughput may be decreased.

An object of an embodiment of the disclosed invention is, in a method for manufacturing an SOI substrate, to improve planarity of a surface of a single crystal semiconductor layer after separation by favorably separating a singe crystal semiconductor substrate even in the case where a non-mass-separation type ion irradiation method is used. Another object of an embodiment of the disclosed invention is, in a method for manufacturing an SOI substrate, to improve planarity of a surface of a single crystal semiconductor layer after separation as well as to improve throughput.

An embodiment of the disclosed invention is, in a method for manufacturing an SOI substrate, to cool a single crystal semiconductor substrate when an embrittled region having a damaged crystal structure is formed in the single crystal semiconductor substrate by irradiating the single crystal semiconductor substrate with accelerated ions using an ion doping method. Further, the single crystal semiconductor substrate may be swung while the single crystal semiconductor substrate is cooled.

An embodiment of the disclosed invention includes the steps of: irradiating a single crystal semiconductor substrate with accelerated ions to form an embrittled region in the single crystal semiconductor substrate; bonding the single crystal semiconductor substrate and a base substrate with an insulating layer interposed therebetween; and separating the single crystal semiconductor substrate along the embrittled region to form a single crystal semiconductor layer over the base substrate with the insulating layer interposed therebetween, in which the single crystal semiconductor substrate is irradiated with the ions by an ion doping method while the single crystal semiconductor substrate is cooled. Further, the single crystal semiconductor substrate may be swung while the single crystal semiconductor substrate is cooled.

An embodiment of the disclosed invention includes the steps of: irradiating a single crystal semiconductor substrate with accelerated ions to form an embrittled region in the single crystal semiconductor substrate; bonding the single crystal semiconductor substrate and a base substrate with an insulating layer interposed therebetween; and separating the single crystal semiconductor substrate along the embrittled region to form a single crystal semiconductor layer over the base substrate with the insulating layer interposed therebetween, in which the single crystal semiconductor substrate is irradiated with the ions through a plurality of steps by an ion doping method. Further, when the single crystal semiconductor substrate is irradiated with the ions through a plurality of steps, the single crystal semiconductor substrate may be cooled after the n-th (n is a natural number of 1 or more) irradiation and before the (n+1)-th irradiation. Further, the single crystal semiconductor substrate may be swung while the single crystal semiconductor substrate is cooled.

In an embodiment of the disclosed invention, since non-mass-separation type ion irradiation is used, a large area can be processed at a time as compared to the case of using mass-separation type ion irradiation. On the other hand, an adverse effect due to the temperature increase of the substrate has to be taken into consideration as compared to the case where local ion irradiation is performed using mass-separation type ion irradiation. As described above, in the case where the temperature increase of the substrate is large, profile of an element derived from added ions is broadened in the single crystal semiconductor substrate. In order to solve the problem, in an embodiment of the disclosed invention, broadening of profile of an element in a depth direction of a single crystal semiconductor substrate is suppressed by suppressing temperature increase of the substrate. Accordingly, efficient ion irradiation is achieved, separation of the single crystal semiconductor substrate is favorably performed, and a surface of a single crystal semiconductor layer after separation can be made planar.

Note that a semiconductor device in this specification generally indicates a device capable of functioning by utilizing semiconductor characteristics, and electro-optic devices, semiconductor circuits, and electronic devices are all semiconductor devices.

In addition, in this specification, a display device includes a light-emitting device and a liquid crystal display device. The light-emitting device includes a light-emitting element, and the liquid crystal display device includes a liquid crystal element. A light-emitting element includes, in its scope, an element whose luminance is controlled by current or voltage, and specifically includes an inorganic electroluminescent (EL) element, an organic EL element, and the like.

According to an embodiment of the disclosed invention, in a method for manufacturing an SOI substrate, even in the case where a non-mass-separation type ion irradiation method is used, a single crystal semiconductor substrate can be favorably separated and planarity of a surface of a single crystal semiconductor layer after separation can be improved.

According to an embodiment of the disclosed invention, in a method for manufacturing an SOI substrate, throughput can be improved and planarity of a surface of a single crystal semiconductor layer after separation can be improved.

BRIEF DESCRIPTION OF THE DRAWINGS

FIG. 2 is a diagram illustrating an example of an ion doping apparatus applicable to a method for manufacturing an SOI substrate.

FIGS. 3A-1 to 3A-3, 3B-1 and 3B-2, 3C, and 3D are diagrams illustrating an example of a method for manufacturing an SOI substrate.

DETAILED DESCRIPTION OF THE INVENTION

Figures 1, 1A:
FIGS. 1A-1 to 1A-3, 1B, 1C, and 1D are diagrams illustrating an example of a method for manufacturing an SOI substrate.

Hereinafter, embodiments and an example of the present invention will be described with reference to the drawings. However, the present invention can be carried out in many different modes, and it is easily understood by those skilled in the art that the mode and detail can be variously changed without departing from the spirit and scope of the present invention. Therefore, the present invention is not interpreted as being limited to the following description of the embodiments and example. Note that, in all the drawings for explaining the embodiments and example, the same portions or portions having the same functions are denoted by the same reference numerals, and the description thereof will be made only once.

Embodiment 1

In this embodiment, an example of a method for manufacturing an SOI substrate will be described with reference to drawings.

First, a single crystal semiconductor substrate 100 is prepared (see FIG. 1A-1).

As the single crystal semiconductor substrate 100, a single crystal semiconductor substrate formed using an element belonging to Group 14, such as a single crystal silicon substrate, a single crystal germanium substrate, or a single crystal silicon germanium substrate, can be used. Alternatively, a compound semiconductor substrate formed of gallium arsenide, indium phosphide, or the like may be used. The size of a commercial silicon substrate is typically 5 inches (125 mm) in diameter, 6 inches (150 mm) in diameter, 8 inches (200 mm) in diameter, 12 inches (300 mm) in diameter, and 16 inches (400 mm) in diameter, and a typical shape thereof is a circular shape. Note that the shape of the single crystal semiconductor substrate 100 is not limited to a circular shape, and a single crystal semiconductor substrate processed into a rectangular shape or the like can also be used.

Figure 1B:
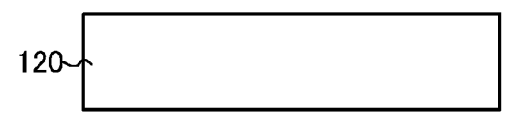
Figures 1, 1A, 2:
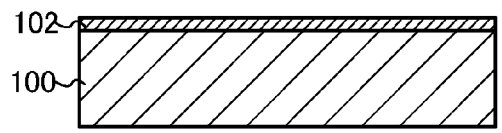

Next, an insulating layer 102 is formed on a surface of the single crystal semiconductor substrate 100 (see FIG. 1A-2).

As the insulating layer 102, a single-layer film of a silicon oxide film, a silicon oxynitride film, a silicon nitride film, a silicon nitride oxide film, or the like, or a stacked-layer film thereof can be used. These films can be formed by a thermal oxidation method, a CVD method, a sputtering method, or the like.

In this specification, silicon oxynitride contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Next, the single crystal semiconductor substrate 100 is irradiated with ions having kinetic energy to form an embrittled region 104 having a damaged crystal structure at a predetermined depth in the single crystal semiconductor substrate 100 (see FIG. 1A-3). As illustrated in FIG. 1A-3, by irradiation of the single crystal semiconductor substrate 100 with accelerated ions 103 through the insulating layer 102, an element derived from the ions 103 is added to a region at a predetermined depth from the surface of the single crystal semiconductor substrate 100, whereby the embrittled region 104 can be formed.

In this embodiment, the embrittled region 104 is formed using a non-mass-separation type ion irradiation method (an ion doping method) by which an object is irradiated with ions which are generated from a source gas and are not subjected to mass separation. Therefore, the ions 103 are obtained as follows: a process gas is excited to generate plasma, and all kinds of ions included in this plasma are extracted from the plasma by the action of an electric field and are then accelerated.

The ion doping method can be performed using an ion doping apparatus. An ion doping apparatus is a non-mass-separation type apparatus for irradiating an object which is disposed in a chamber with all kinds of ions which are generated by plasma excitation of a process gas and are not subjected to mass separation.

For example, in this embodiment, an ion doping apparatus illustrated in FIG. 2 can be used.

The ion doping apparatus illustrated in FIG. 2 includes an ion source 200 for generating ions and a treatment chamber 220 for performing ion irradiation on an object. Further, the ion source 200 includes a plasma generating chamber 202 for generating plasma, an electrode 204 for generating plasma, a gas introduction port 206 for introducing a process gas, and an extraction acceleration mechanism 208 for extracting ions from the generated plasma and acceleration of the ions.

As the electrode 204 for generating plasma, a filament electrode, a capacitive coupling high-frequency discharging electrode, or the like can be used. The extraction acceleration mechanism 208 includes an extraction electrode 208a, an accelerating electrode 208b, a suppression electrode 208c, a ground electrode 208d, a power supply for supplying power to these electrodes, and the like. These electrodes that are included in the extraction acceleration mechanism are provided with a plurality of openings or slits, through which ions that are generated from the ion source 200 are accelerated.

The treatment chamber 220 includes a substrate supporting base 222 for holding a substrate and a cooling unit 224 for cooling the substrate. In addition, the treatment chamber 220 is provided with a gas exhaust port 226.

Hereinafter, an ion irradiation method in the case of using the apparatus in FIG. 2 is specifically described. In the following description, the case where the single crystal semiconductor substrate 100 is irradiated with hydrogen ions is described.

First, a process gas is introduced into the plasma generating chamber 202, and the process gas is excited by applying a high-frequency power between the electrode 204 and the extraction electrode 208a, whereby plasma is generated. For example, in the case where a hydrogen ($H_2$) gas is supplied as the process gas, ion species ($H^+$, $H_2^+$, $H_3^+$) which are generated from the hydrogen gas are generated. Subsequently, by applying voltage to the electrodes which are provided in the extraction acceleration mechanism 208, ions are extracted from the plasma and accelerated, and the single crystal semiconductor substrate 100 provided on the substrate supporting base 222 is irradiated with the ions, whereby the embrittled region 104 is formed.

In FIG. 2, ions are accelerated by the extraction electrode 208a to which extraction voltage is applied and the accelerating electrode 208b to which acceleration voltage is applied. The suppression electrode 208c catches and gathers scattering ions to increase directivity of the ion flow.

Further, in this embodiment, when irradiation with the ions 103 is performed, the single crystal semiconductor substrate 100 is cooled. The single crystal semiconductor substrate 100 can be cooled by using the cooling unit 224 which is provided for the substrate supporting base 222.

As the cooling unit 224, a structure in which the temperature increase of the single crystal semiconductor substrate 100 in performing irradiation with the ions 103 can be suppressed may be employed, and for example, a structure in which cold water is made to flow in the substrate supporting base 222 can be employed. Alternatively, a structure in which a Peltier element or the like is used may be employed.

As the substrate supporting base 222, an electrostatic chuck can be used. The electrostatic chuck is a mechanism in which a dielectric layer is provided on a surface of the substrate supporting base, voltage is applied between the substrate supporting base and a single crystal semiconductor substrate, and the single crystal semiconductor substrate sticks to the substrate supporting base by force generated between the substrate supporting base and the single crystal semiconductor substrate. The electrostatic chuck is formed using a material having high thermal conductivity, and is provided with high cooling capability. Further, in order to cool and uniformly heat the single crystal semiconductor substrate, it is effective that a slit is formed on a surface, to which the single crystal semiconductor substrate sticks, of the electrostatic chuck, so that a gas flow path is formed.

When irradiation with the ions 103 is performed, the single crystal semiconductor substrate 100 may be swung. The single crystal semiconductor substrate 100 can be swung by using a swinging unit 228 which is provided for the substrate supporting base 222 (see FIG. 12). Irradiation with the ions is performed while the single crystal semiconductor substrate 100 is swung, whereby irradiation unevenness due to the openings or the slits provided in the extraction acceleration mechanism 208 can be suppressed. Further, by local temperature increase of the single crystal semiconductor substrate 100, thermal diffusion of the element derived from the added ions in the single crystal semiconductor substrate 100 is suppressed, distribution unevenness of the element in a horizontal direction can be suppressed, and broadening of the distribution in a depth direction can be reduced.

As the swinging unit 228, a structure in which the single crystal semiconductor substrate 100 can be moved in performing irradiation with the ions 103 may be employed. For example, a structure in which the single crystal semiconductor substrate 100 is moved in one axis direction or a structure in which the single crystal semiconductor substrate 100 is moved in two axis directions may be employed. It is needless to say that a unit capable of moving the substrate in a more complicated manner (such as rotation of the substrate) can be used.

Figure 12:
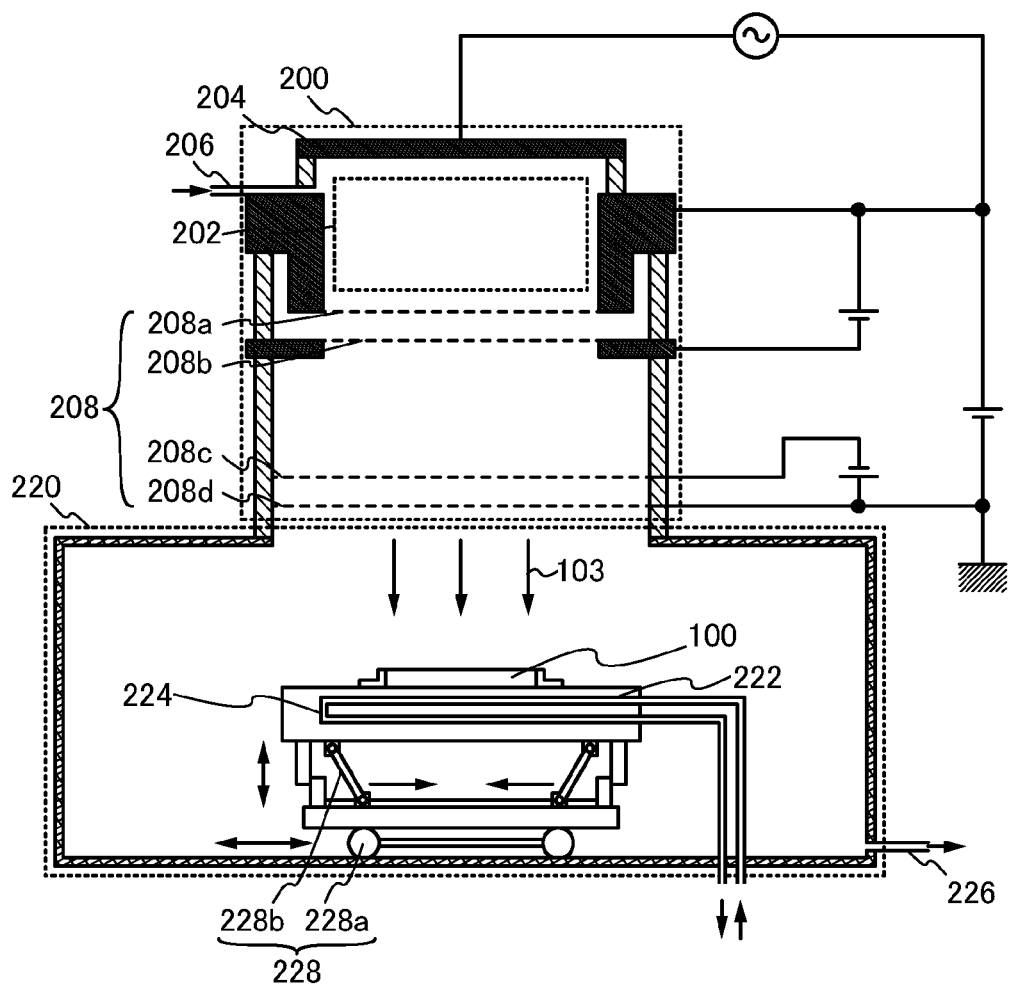
FIG. 12 is a diagram illustrating an example of an ion doping apparatus applicable to a method for manufacturing an SOI substrate.

In a structure illustrated in FIG. 12, the case where a horizontal moving mechanism 228a and a vertical moving mechanism 228b are provided and the single crystal semiconductor substrate 100 can be moved in vertical and horizontal directions is described. It is needless to say that, in the structure in FIG. 12, one of the horizontal moving mechanism 228a and the vertical moving mechanism 228b may be provided.

Further, in the case where a plurality of openings are regularly provided in the electrode, the single crystal semiconductor substrate 100 is preferably swung in a direction that is slightly deviated from a direction of regular alignment of the openings. For example, in the case where the openings are regularly aligned along an a axis and a b axis, the single crystal semiconductor substrate 100 is swung in a direction other than directions along the a axis and the b axis. Accordingly, irradiation unevenness due to a regular pattern of openings can be reduced.

Note that, in addition to the case where the single crystal semiconductor substrate 100 is swung, a potential difference may be generated in a direction parallel to the single crystal semiconductor substrate 100 so as to control a direction of irradiation with the ions 103 with which the single crystal semiconductor substrate 100 is irradiated. It is needless to say that the controlling of the direction of the irradiation with the ions 103 may be combined with swing of the single crystal semiconductor substrate 100.

Further, when irradiation with the ions 103 is performed, the single crystal semiconductor substrate 100 may be cooled while the single crystal semiconductor substrate 100 is swung. The single crystal semiconductor substrate 100 can be cooled by using the cooling unit 224 which is provided for the substrate supporting base 222.

In such a manner, irradiation with the ions 103 is performed while the single crystal semiconductor substrate 100 is cooled; thus, the temperature increase of the single crystal semiconductor substrate 100 can be suppressed even in the case where a large area of the single crystal semiconductor substrate 100 is irradiated with the ions at a time. As a result, thermal diffusion of the ions used for irradiation can be suppressed, and broadening of distribution of the added ions in a depth direction can be reduced. Further, irradiation with the ions 103 is performed while the single crystal semiconductor substrate 100 is swung, whereby the temperature increase of the single crystal semiconductor substrate 100 can be suppressed and irradiation unevenness due to the openings or the slits which are provided in the extraction acceleration mechanism can be suppressed.

Further, by suppression of the temperature increase of the single crystal semiconductor substrate 100, release of hydrogen which is added in the single crystal semiconductor substrate 100 can be reduced. Accordingly, time for irradiation with the ions 103 can be shortened and throughput can be improved.

The thickness of a single crystal semiconductor layer separated from the single crystal semiconductor substrate 100 is determined in accordance with a depth at which the ions 103 are added. In this embodiment, the depth at which the embrittled region 104 is formed is adjusted so that the thickness of this single crystal semiconductor layer is greater than or equal to 10 nm and less than or equal to 500 nm, preferably greater than or equal to 50 nm and less than or equal to 200 nm. The depth at which the embrittled region 104 is formed may be adjusted by kinetic energy, mass, incident angle of the ions 103, or the like. Note that the kinetic energy can be adjusted by acceleration voltage, dose, or the like.

Further, in this embodiment, in the above-described ion irradiation method, the proportion of $H_3^+$ ions with respect to the total number of ion species ($H^+$, $H_2^+$, $H_3^+$) generated from the hydrogen gas is 50% or higher, preferably, 70% or higher. This is because ions can be added in a concentrated manner to the same depth in the single crystal semiconductor substrate 100 by irradiation with ions having the same mass.

In order to form the embrittled region 104 in a shallow region, generally, the acceleration voltage of the ions 103 needs to be low; however, in the case where $H_3^+$ ions are used, hydrogen atoms are added in a shallower region as compared to the case where $H^+$ ions are used even if the acceleration voltage are the same in both cases. This is probably because $H_3^+$ ions are split into its constituent elements (H) in the single crystal semiconductor substrate 100, and as a result, the kinetic energy of each element (H) is about one-third as large as that of $H_3^+$ ions. That is, by increasing the proportion of $H_3^+$ ions in the plasma, hydrogen atoms can be efficiently added to a shallow region of the single crystal semiconductor substrate 100. On the other hand, the mass of an $H_3^+$ ion is three times as large as that of an $H_3^+$ ion, and in the case of adding hydrogen atoms to the same depth, the acceleration voltage of the $H_3^+$ ion should be three times as high as that of the $H^+$ ion. Therefore, when the acceleration voltage of ions can be increased, the cycle time of an ion irradiation step can be shortened in the case of adding the hydrogen atoms to the same depth, and productivity and throughput can be improved.

In the case where the hydrogen gas is used as a process gas, the proportion of $H_3^+$ ions in the plasma is increased and a large area of the single crystal semiconductor substrate 100 is irradiated with the ions 103 at a time, whereby throughput can be improved. In addition, the single crystal semiconductor substrate 100 is irradiated with the ions 103 while the single crystal semiconductor substrate 100 is cooled, whereby the temperature increase of the single crystal semiconductor substrate 100 can be suppressed and a width of a region where the embrittled region 104 is formed in a depth direction can be reduced.

Further, in the above description, although the case where the hydrogen gas is used as a process gas is described, the process gas that can be applied to this embodiment is not limited thereto. For example, a helium (He) gas can be used as the process gas. Since most of the ion species produced by exciting helium are $He^+$, the single crystal semiconductor substrate 100 can be irradiated with $He^+$ as main ions even in an ion doping method in which mass separation is not performed. In this case, in a depth direction of the single crystal semiconductor substrate 100, the width of the region where the embrittled region 104 is formed can be reduced. It is needless to say that $H_3^+$ ions and $He^+$ ions may be used in combination for irradiation. In this case, surface roughness of a surface of the semiconductor layer can be suppressed without increasing the number of steps.

Note that, in this embodiment, a structure of the ion doping apparatus is not limited to the structure illustrated in FIG. 2 as long as the single crystal semiconductor substrate 100 can be cooled in performing irradiation with ions, and a structure as needed can be employed.

Further, although the case where the single crystal semiconductor substrate 100 is irradiated with the accelerated ions 103 through the insulating layer 102 is described in this embodiment, the insulating layer 102 may be formed after the single crystal semiconductor substrate 100 is irradiated with the ions 103.

Subsequently, a base substrate 120 is prepared (see FIG. 1B), and the single crystal semiconductor substrate 100 and the base substrate 120 are bonded to each other.

As the base substrate 120, for example, a substrate formed using an insulator can be used. In specific, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. In addition, as the base substrate 120, a single crystal semiconductor substrate (for example, a single crystal silicon substrate) or a polycrystalline semiconductor substrate (for example, a polycrystalline silicon substrate) may be used.

In this embodiment, a glass substrate is preferably used as the base substrate 120. When a glass substrate that can have a large area and is inexpensive is used as the base substrate 120, cost reduction can be achieved. In particular, when a mother glass substrate having a large area, such as a so-called sixth generation (1500 mm×1850 mm), a so-called seventh generation (1870 mm×2200 mm), or a so-called eighth generation (2200 mm×2400 mm) is used, for example, as the base substrate 120, a plurality of single crystal semiconductor substrates are bonded to the mother substrate to manufacture an SOI substrate. Thus, the SOI substrate can have a large area.

Figures 1, 1A, 2, 3:
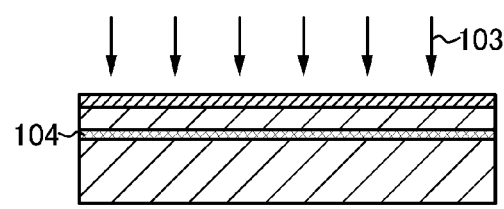
Figure 1C:
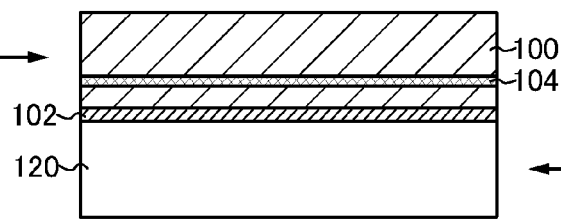

Next, the single crystal semiconductor substrate 100 and the base substrate 120 are bonded to each other with the insulating layer 102 interposed therebetween (see FIG. 1C). Here, the single crystal semiconductor substrate 100 and the base substrate 120 are disposed to face each other, and a surface of the insulating layer 102 and a surface of the base substrate 120 are bonded to each other.

Figure 1D:
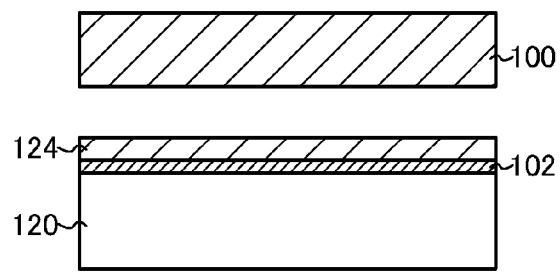
Figure 2:
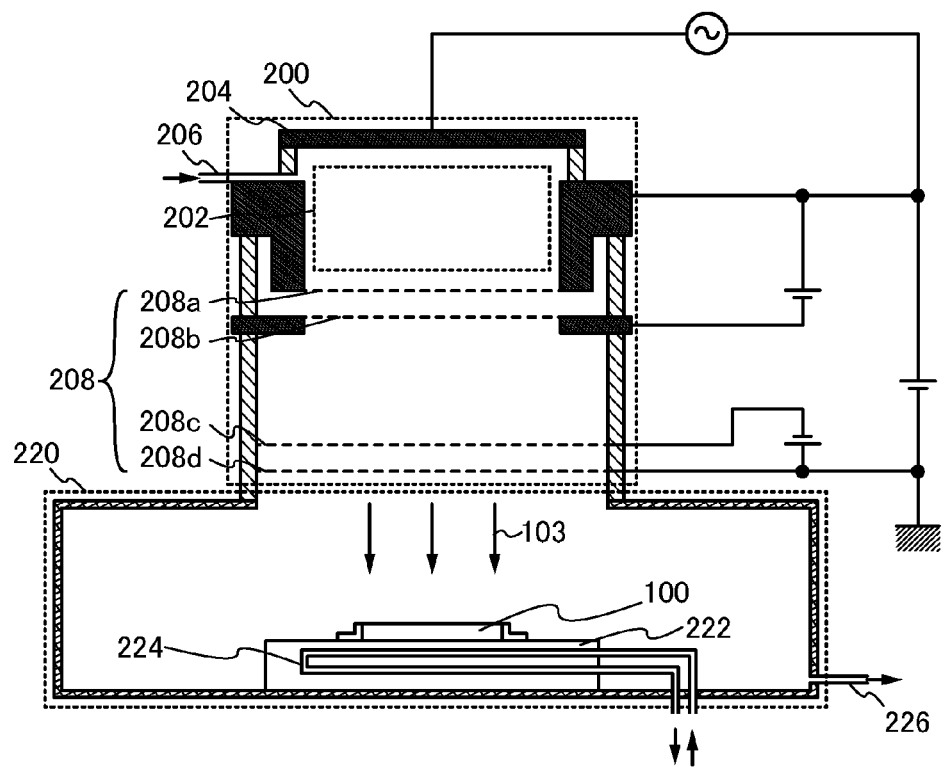

Next, the single crystal semiconductor substrate 100 is separated along the embrittled region 104 by heat treatment, whereby a single crystal semiconductor layer 124 is provided over the base substrate 120 with the insulating layer 102 interposed therebetween (see FIG. 1D).

When the heat treatment is performed, the element added is separated out into microvoids which are formed in the embrittled region 104 by temperature increase, and internal pressure of the microvoids is increased. By increasing the pressure, the microvoids in the embrittled region 104 are changed in volume and a crack is generated in the embrittled region 104. Thus, the single crystal semiconductor substrate 100 is separated along the embrittled region 104. Because the insulating layer 102 is bonded to the base substrate 120, the single crystal semiconductor layer 124 which is separated from the semiconductor substrate 100 is formed over the base substrate 120.

Further, in this embodiment, as described above, the width of the embrittled region 104 which is formed in the single crystal semiconductor substrate 100, in the depth direction, can be reduced. Therefore, the single crystal semiconductor substrate 100 can be favorably separated. Further, a surface of the single crystal semiconductor layer 124 after separation can be planar.

Note that, for the heat treatment, a diffusion furnace, a heating furnace such as a resistance heating furnace, a rapid thermal annealing (RTA) apparatus, a microwave heating apparatus, or the like can be used. For example, the heat treatment can be performed using an RTA apparatus at a heating temperature of greater than or equal to 550° C. and less than or equal to 730° C., for a processing time of greater than or equal to 0.5 minutes and less than or equal to 60 minutes. Further, here, the temperature in the heat treatment is set so as not to exceed the strain point of the base substrate 120.

Through the above steps, an SOI substrate in which the single crystal semiconductor layer 124 is provided over the base substrate 120 with the insulating layer 102 interposed therebetween can be manufactured.

By employment of the manufacturing method described in this embodiment, even in the case where a non-mass-separation type ion irradiation method is used, the single crystal semiconductor substrate 100 can be favorably separated and planarity of the surface of the single crystal semiconductor layer 124 after separation can be improved.

Note that the method for manufacturing an SOI substrate described in this embodiment can be combined with manufacturing methods in another embodiment in this specification, as appropriate.

Embodiment 2

In this embodiment, a method for cooling the single crystal semiconductor substrate 100 in performing ion irradiation, which is different from that in the above embodiment, is described.

As described above, in the case where an ion doping method is used, a large area is irradiated with ions at a time; therefore, the temperature of the single crystal semiconductor substrate 100 is increased. Accordingly, as the ion irradiation time increases, the temperature of the single crystal semiconductor substrate 100 increases. That is, there is a large difference between the temperature of the single crystal semiconductor substrate 100 at the time when ion irradiation is started and the temperature of the single crystal semiconductor substrate 100 at the time when ion irradiation is completed.

Therefore, at the time when ion irradiation is started, thermal diffusion of the element derived from the added ions hardly occurs; however, as irradiation with the ions proceeds, the temperature of the single crystal semiconductor substrate 100 is increased, whereby thermal diffusion of the element derived from the added ions occurs and distribution of the element in a depth direction is broadened. Further, as the temperature of the single crystal semiconductor substrate 100 increases, desorption of the element derived from the ions added to and existing in the substrate is promoted; thus, throughput is reduced. When the throughput is reduced, a problem arises in that the irradiation time is increased, and the temperature of the single crystal semiconductor substrate 100 is further increased. If the temperature of the single crystal semiconductor substrate 100 is increased too much, the single crystal semiconductor substrate 100 may be separated during addition of the ions.

Thus, in this embodiment, the single crystal semiconductor substrate 100 is irradiated with the ions through a plurality of steps, at least two steps. That is, even in the case where a whole surface of the single crystal semiconductor substrate 100 is irradiated with the ions at a time using an ion doping method, time required for each irradiation step is shortened and ion irradiation is performed through a plurality of steps. Note that even in the case where ion irradiation is performed through a plurality of steps, the single crystal semiconductor substrate 100 may be swung while being irradiated with the ions.

By shortening the ion irradiation time, the temperature increase of the single crystal semiconductor substrate 100 due to the ion irradiation can be suppressed, and thermal diffusion of the element derived from the added ions can be reduced. Further, desorption of the element derived from the ions added to and existing in the single crystal semiconductor substrate 100 can be reduced.

Note that the ion irradiation time may be determined depending on the temperature of the single crystal semiconductor substrate 100 when the ion irradiation is performed. For example, the temperature of the single crystal semiconductor substrate 100 when the ion irradiation is performed is measured, the ion irradiation is stopped before the temperature of the single crystal semiconductor substrate 100 exceeds a predetermined temperature, the temperature of the single crystal semiconductor substrate 100 is decreased, and the single crystal semiconductor substrate 100 is irradiated with the ions again. For example, in irradiating the single crystal semiconductor substrate 100 with the ions through a plurality of steps, the temperature of the single crystal semiconductor substrate 100 can be decreased after the n-th (n is a natural number of 1 or more) irradiation and before the (n+1)-th irradiation.

The predetermined temperature can be set at 200° C., for example. This is because the desorption of the added ions tends to be increased while the thermal diffusion of the ions is increased at the temperature higher than 200° C. Further, in performing ion irradiation through a plurality of steps, the single crystal semiconductor substrate 100 may be actively cooled to decrease the temperature of the single crystal semiconductor substrate 100 when the single crystal semiconductor substrate 100 has not been irradiated with ions.

Note that the cooling method described in this embodiment may be implemented in combination with the cooling method described in the above embodiment.

That is, the single crystal semiconductor substrate 100 can be cooled while the single crystal semiconductor substrate 100 is irradiated with the ions through a plurality of steps. At this time, even in the case where a large area of the single crystal semiconductor substrate 100 is irradiated with the ions 103 at a time, the temperature increase of the single crystal semiconductor substrate 100 can be effectively suppressed. In addition, since the temperature increase of the single crystal semiconductor substrate 100 in the ion irradiation can be suppressed by the cooling unit, the ion irradiation time can be prolonged.

Note that the method for manufacturing an SOI substrate described in this embodiment can be combined with manufacturing methods in another embodiment in this specification, as appropriate.

Embodiment 3

In this embodiment, in the manufacturing method described in any of the above embodiments, a method for bonding the single crystal semiconductor substrate 100 and the base substrate 120 is described in detail with reference to the drawings.

First, the single crystal semiconductor substrate 100 is prepared (see FIG. 3A-1). Note that it is preferable that the surface of the single crystal semiconductor substrate 100 be cleaned as appropriate in advance using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like in terms of removing contamination. Further, diluted hydrogen fluoride and ozone water may be discharged alternately to clean the single crystal semiconductor substrate 100.

Next, an oxide film 132 is formed on the surface of the single crystal semiconductor substrate 100 (see FIG. 3A-2). As the oxide film 132, for example, a single-layer film of a silicon oxide film, a silicon oxynitride film, or the like, or a stacked-layer film thereof can be used. These films can be formed by a thermal oxidation method, a CVD method, a sputtering method, or the like. In addition, when the oxide film 132 is formed by a CVD method, a silicon oxide film formed by using organosilane such as tetraethoxysilane (abbreviation: TEOS, chemical formula: $Si(OC_2H_5)_4$) is preferably used as the oxide film 132 in terms of productivity.

In this embodiment, the oxide film 132 (here, a SiOx film) is formed by performing thermal oxidation treatment on the single crystal semiconductor substrate 100 (see FIG. 3A-2). The thermal oxidation treatment is preferably performed in an oxidizing atmosphere to which a halogen is added.

For example, the single crystal semiconductor substrate 100 is subjected to thermal oxidation treatment in an oxidizing atmosphere to which chlorine (Cl) is added, whereby the oxide film 132 is formed through chlorine oxidation. In this case, the oxide film 132 contains chlorine atoms.

The chlorine atoms contained in the oxide film 132 forms distortions. As a result, absorption of moisture into the oxide film 132 is improved and diffusion rate is increased. That is, when moisture is present on a surface of the oxide film 132, the moisture present on the surface of the oxide film 132 can be rapidly absorbed and diffused into the oxide film 132.

As an example of thermal oxidation treatment, thermal oxidation can be performed in an oxidizing atmosphere which contains hydrogen chloride (HCl) at a proportion of 0.5 vol. % to 10 vol. % (preferably, 3 vol. %) with respect to oxygen at a temperature of 900° C. to 1150° C. (typically, 1000° C.). Treatment time may be set to 0.1 to 6 hours, preferably 0.5 to 1 hour. The thickness of an oxide film to be formed is set to 10 nm to 1000 nm (preferably, 50 nm to 300 nm), for example, 100 nm.

In this embodiment, the concentration of chlorine atoms in the oxide film 132 is controlled to $1\times10^{17}$ atoms/cm$^3$ to $1\times10^{21}$ atoms/cm$^3$. The inclusion of chlorine atoms in the oxide film 132 is effective in preventing contamination of the single crystal semiconductor substrate 100 by trapping heavy metal (for example, Fe, Cr, Ni, or Mo) that is an extrinsic impurity.

When a halogen such as chlorine is contained in the oxide film 132 by HCl oxidation or the like, the oxide film 132 can serve to getter impurities (e.g., movable ions of Na) which adversely affect the single crystal semiconductor substrate. That is, by heat treatment which is performed after the oxide film 132 is formed, impurities included in the single crystal semiconductor substrate are separated out to the oxide film 132 and captured by reacting with the halogen (e.g., chlorine). Accordingly, the impurities captured in the oxide film 132 can be fixed and prevented from contaminating the single crystal semiconductor substrate 100. Further, when bonded to a glass substrate, the oxide film 132 can function as a film for fixing impurities such as Na included in the glass substrate.

In particular, containing a halogen such as chlorine in the oxide film 132 by HCl oxidation or the like is effective in the case where the semiconductor substrate is not sufficiently cleaned or in removing contamination of the semiconductor substrate which is repeatedly reused.

Note that halogen atoms contained in the oxide film 132 are not limited to the chlorine atoms. The oxide film 132 may contain fluorine atoms. The surface of the single crystal semiconductor substrate 100 can be oxidized with fluorine by thermal oxidation treatment in an oxidizing atmosphere after immersion of the surface of the single crystal semiconductor substrate 100 into hydrofluoric acid or by thermal oxidation treatment in an oxidizing atmosphere to which $NF_3$ is added.

Next, the single crystal semiconductor substrate 100 is irradiated with the ions 103 having kinetic energy to form the embrittled region 104 having a damaged crystal structure at a predetermined depth in the single crystal semiconductor substrate 100 (see FIG. 3A-3). The embrittled region 104 is formed in such a manner: the single crystal semiconductor substrate 100 is irradiated with the ions 103 while the single crystal semiconductor substrate 100 is cooled as described in any of the above embodiments.

Further, in the case where an ion doping method is used, heavy metals may also be introduced; however, by irradiation with ions through the oxide film 132 containing chlorine atoms, the single crystal semiconductor substrate 100 can be prevented from being contaminated due to the heavy metals.

Next, the base substrate 120 is prepared (see FIG. 3B-1).

Before the base substrate 120 is used, it is preferable that the surface of the base substrate 120 be cleaned in advance. Specifically, the base substrate 120 is subjected to ultrasonic cleaning using a hydrochloric acid/hydrogen peroxide mixture (HPM), a sulfuric acid/hydrogen peroxide mixture (SPM), an ammonium hydroxide/hydrogen peroxide mixture (APM), diluted hydrofluoric acid (DHF), or the like. For example, it is preferable that the surface of the base substrate 120 be subjected to ultrasonic cleaning using a hydrochloric acid/hydrogen peroxide mixture. By such cleaning treatment, the surface of the base substrate 120 can be planarized and residual abrasive particles can be removed.

Next, a nitrogen-containing layer 121 (for example, an insulating film containing nitrogen such as a silicon nitride film or a silicon nitride oxide film) is formed on the surface of the base substrate 120 (see FIG. 3B-2).

In this embodiment, the nitrogen-containing layer 121 serves as a layer (bonding layer) which is to be bonded to the oxide film 132 provided on the single crystal semiconductor substrate 100. In addition, when a single crystal semiconductor layer having a single crystal structure is provided over the base substrate later, the nitrogen-containing layer 121 also functions as a barrier layer for preventing impurities such as Na (sodium) contained in the base substrate from diffusing into the single crystal semiconductor layer.

Further, since the nitrogen-containing layer 121 is used as a bonding layer, a surface of the nitrogen-containing layer 121 is preferably smooth for suppressing defective bonding. Specifically, the nitrogen-containing layer 121 is formed to have a surface with an average surface roughness (Ra) of 0.50 nm or less and a root-mean-square surface roughness (Rms) of 0.60 nm or less, preferably, an average surface roughness of 0.35 nm or less and a root-mean-square surface roughness of 0.45 nm or less. The thickness is preferably in the range of 10 nm to 200 nm, more preferably, 50 nm to 100 nm.

Next, the surface of the single crystal semiconductor substrate 100 and the surface of the base substrate 120 are disposed to face each other, and the surface of the oxide film 132 and the surface of the nitrogen-containing layer 121 are bonded to each other (see FIG. 3C).

Here, after the single crystal semiconductor substrate 100 and the base substrate 120 are disposed in contact with each other with the oxide film 132 and the nitrogen-containing layer 121 interposed therebetween, a pressure of about 0.1 to 500 $N/cm^2$, preferably, 1 to 20 $N/cm^2$ is applied to a part of the single crystal semiconductor substrate 100. Bonding between the oxide film 132 and the nitrogen-containing layer 121 begins at the pressed portion and then the spontaneous bonding proceeds throughout the surface. This bonding step is performed by the action of van der Waals force or hydrogen bonding and can be performed at room temperature without any heat treatment. Thus, a substrate having a low allowable temperature limit, such as a glass substrate, can be used as the base substrate 120.

Note that, before the single crystal semiconductor substrate 100 and the base substrate 120 are bonded to each other, the oxide film 132 formed on the single crystal semiconductor substrate 100 and the nitrogen-containing layer 121 formed over the base substrate 120 are preferably subjected to surface treatment.

As surface treatment, plasma treatment, ozone treatment, megasonic cleaning, two fluid cleaning (a method for spraying functional water such as pure water or hydrogen-containing water with a carrier gas such as nitrogen), or a combination thereof can be performed. In particular, after plasma treatment is performed on at least one of the surface of the oxide film 132 and the surface of the nitrogen-containing layer 121, ozone treatment, megasonic cleaning, two fluid cleaning, or the like is performed, whereby dust such as organic substances on the surface of the oxide film 132 and the surface of the nitrogen-containing layer 121 can be removed and the surfaces can be made hydrophilic. As a result, bonding strength between the oxide film 132 and the nitrogen-containing layer 121 can be improved.

Here, an example of ozone treatment is described. For example, ozone treatment can be performed on a surface of an object by irradiation with ultraviolet (UV) in an atmosphere containing oxygen. Ozone treatment in which irradiation with ultraviolet is performed under an atmosphere containing oxygen is also called UV ozone treatment, ultraviolet ozone treatment, or the like. In an atmosphere containing oxygen, irradiation with ultraviolet light having a wavelength of less than 200 nm and ultraviolet light having a wavelength of greater than or equal to 200 nm is performed, whereby ozone can be generated and singlet oxygen can be generated from the ozone. Irradiation with ultraviolet light having a wavelength of less than 180 nm is performed, whereby ozone can be generated and singlet oxygen can be generated from the ozone.

Examples of reactions which occur by performing irradiation with ultraviolet light having a wavelength of less than 200 nm and ultraviolet light having a wavelength of greater than or equal to 200 nm in an atmosphere containing oxygen are described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), irradiation with ultraviolet light (hv) having a wavelength ($\lambda_1$ nm) of less than 200 nm in an atmosphere containing oxygen ($O_2$) is performed to generate an oxygen atom ($O(^3P)$) in a ground state. Next, in the reaction formula (2), the oxygen atom ($O(^3P)$) in a ground state and oxygen ($O_2$) are reacted with each other to generate ozone ($O_3$). Then, in the reaction formula (3), irradiation with ultraviolet light having a wavelength ($\lambda_2$ nm) of greater than or equal to 200 nm in an atmosphere containing the generated ozone ($O_3$) is performed to generate singlet oxygen $O(^1D)$ in an excited state. In an atmosphere containing oxygen, irradiation with ultraviolet light having a wavelength of less than 200 nm is performed to generate ozone while irradiation with ultraviolet light having a wavelength of greater than or equal to 200 nm is performed to generate singlet oxygen from decomposing the ozone. The ozone treatment as described above, for example, can be performed by irradiation with light of a low-pressure mercury lamp ($\lambda_1$=185 nm, $\lambda_2$=254 nm) in an atmosphere containing oxygen.

In addition, examples of reactions which occur by performing irradiation with ultraviolet light having a wavelength of less than 180 nm in an atmosphere containing oxygen are described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with ultraviolet light having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), the oxygen atom ($O(^3P)$) in a ground state and oxygen ($O_2$) are reacted with each other to generate ozone ($O_3$). In the reaction formula (6), irradiation with ultraviolet light having a wavelength ($\lambda_3$ nm) of less than 180 nm in an atmosphere containing the generated ozone ($O_3$) is performed to generate singlet oxygen in an excited state and oxygen. In an atmosphere containing oxygen, irradiation with ultraviolet light having a wavelength of less than 180 nm is performed to generate ozone and to generate singlet oxygen by decomposing the ozone or oxygen. The ozone treatment as described above, for example, can be performed by irradiation with light of a Xe excimer UV lamp ($\lambda_3$=172 nm) in an atmosphere containing oxygen.

Chemical bonding of an organic substance attached to a surface of an object is cut by light having a wavelength of less than 200 nm, whereby the organic substance attached to the surface of the object or the organic substance whose chemical bonding is cut can be removed by oxidative decomposition with ozone or singlet oxygen generated by ozone. By performing ozone treatment as described above, a hydrophilic property and purity of the surface of the object can be increased, and bonding can be favorably performed.

In an atmosphere containing oxygen, ozone is generated by performing irradiation with ultraviolet. Ozone is effective in removal of the organic substance attached to the surface of the object. In addition, singlet oxygen is also effective in removal of the organic substance attached to the surface of the object as much as or more than ozone. Ozone and singlet oxygen are examples of oxygen in an active state, and collectively called active oxygen. As described with the above reaction formulae and the like, since there are reactions in which ozone is generated in generating singlet oxygen or singlet oxygen is generated from ozone, here, such reactions including a reaction in which singlet oxygen contributes are called ozone treatment for convenience.

Note that, after the oxide film 132 and the nitrogen-containing layer 121 are bonded to each other, heat treatment is preferably performed in order to increase the bonding strength. This heat treatment is performed at a temperature where a crack is not generated in the embrittled region 104 and is performed at a temperature higher than or equal to room temperature and lower than 400° C., for example. The oxide film 132 and the nitrogen-containing layer 121 may be bonded to each other while heating is performed at a temperature within the above range. The heat treatment can be performed using a diffusion furnace, a heating furnace such as a resistance heating furnace, a rapid thermal annealing (RTA) apparatus, a microwave heating apparatus, or the like.

Generally, when heat treatment is performed at the same time as or after bonding the oxide film 132 and the nitrogen-containing layer 121 to each other, dehydration reaction at the bonding interface proceeds and bond is strengthened by strengthening of hydrogen bonding and formation of covalent bonding. In order to promote the dehydration reaction, moisture generated at the bonding interface through the dehydration reaction should be removed by heat treatment at high temperature. In other words, when heat treatment after bonding is performed at low temperature, moisture generated at the bonding interface through a dehydration reaction cannot be removed effectively; thus, the dehydration reaction does not progress and bonding strength cannot be improved sufficiently.

On the other hand, in the case where an oxide film containing chlorine atoms or the like is used as the oxide film 132, the oxide film 132 can absorb and diffuse moisture. Accordingly, even when heat treatment after bonding is performed at low temperature, moisture generated at the bonding interface through the dehydration reaction can be absorbed and diffused into the oxide film 132 and the dehydration reaction can be promoted efficiently. In this case, even when a low heat-resistant substrate such as a glass substrate is used as the base substrate 120, the bonding strength between the oxide film 132 and the nitrogen-containing layer 121 can be sufficiently improved. Further, when plasma treatment is performed by applying a bias voltage, moisture can be effectively absorbed and diffused into the oxide film 132 by a micropore formed in the vicinity of the surface of the oxide film 132. Accordingly, the bonding strength between the oxide film 132 and the nitrogen-containing layer 121 can be improved even when heat treatment is performed at low temperature.

Next, heat treatment is performed to cause separation along the embrittled region 104, whereby the single crystal semiconductor layer 124 is provided over the base substrate 120 with the oxide film 132 and the nitrogen-containing layer 121 interposed therebetween (see FIG. 3D).

When the heat treatment is performed, the element added is separated out into microvoids which are formed in the embrittled region 104 by temperature increase, and internal pressure of the microvoids is increased. By increasing the pressure, the microvoids in the embrittled region 104 are changed in volume and a crack is generated in the embrittled region 104. Thus, the single crystal semiconductor substrate 100 is cleaved along the embrittlement region 104. Because the oxide film 132 is bonded to the base substrate 120, the single crystal semiconductor layer 124 which is separated from the single crystal semiconductor substrate 100 is formed over the base substrate 120. This heat treatment is performed at a temperature not exceeding the strain point of the base substrate 120.

This heat treatment can be performed using a diffusion furnace, a heating furnace such as a resistance heating furnace, a rapid thermal annealing (RTA) apparatus, a microwave heating apparatus, or the like. For example, the heat treatment can be performed using an RTA apparatus at a heating temperature of 550° C. to 730° C. for 0.5 minute to 60 minutes.

Note that, by the heat treatment of FIG. 3D without the above-described heat treatment for increasing the bonding strength between the base substrate 120 and the oxide film 132, the heat treatment step for increasing the bonding strength between the oxide film 132 and the nitrogen-containing layer 121 and the heat treatment step for causing separation along the embrittled region 104 may be performed at the same time.

Through the above steps, an SOI substrate in which the single crystal semiconductor layer 124 is provided over the base substrate 120 with the oxide film 132 and the nitrogen-containing layer 121 interposed therebetween can be manufactured.

By employment of the method described in this embodiment, even in the case where the nitrogen-containing layer 121 is used as a bonding layer, bonding strength between the base substrate 120 and the single crystal semiconductor layer 124 can be improved and reliability can be improved. As a result, diffusion of impurities into the single crystal semiconductor layer 124 formed over the base substrate 120 can be suppressed and an SOI substrate in which the base substrate 120 and the single crystal semiconductor layer 124 are strongly bonded to each other can be formed.

In addition, by providing the nitrogen-containing layer on the base substrate side and forming the oxide film containing a halogen such as chlorine on the semiconductor substrate side, a manufacturing process can be simplified and impurity elements can be prevented from entering the semiconductor substrate before bonding the semiconductor substrate and the base substrate to each other. Further, by forming the oxide film containing a halogen such as chlorine as a bonding layer which is provided on the semiconductor substrate side, bonding strength can be improved by encouraging dehydrogenation reaction efficiently even when the heat treatment after bonding is performed at low temperature.

After that, as described in Embodiment 1, the single crystal semiconductor substrate 100 which is separated can be reused in a manufacturing process of an SOI substrate.

Note that, the case where the oxide film 132 is formed on the single crystal semiconductor substrate 100 and the nitrogen-containing layer 121 is formed over the base substrate 120 is described in this embodiment; however, an embodiment of the present invention is not limited thereto. For example, the oxide film 132 and a nitrogen-containing layer are stacked over the single crystal semiconductor substrate 100 in this order, and a surface of the nitrogen-containing layer formed over the oxide film 132 may be bonded to the surface of the base substrate 120. In this case, the nitrogen-containing layer may be formed either before or after the embrittled region 104 is formed. Note that an oxide film (for example, silicon oxide) may be formed over the nitrogen-containing layer to bond a surface of the oxide film and the surface of the base substrate 120.

In the case where intrusion of impurities into the single crystal semiconductor layer 124 from the base substrate 120 does not cause any problems, the nitrogen-containing layer 121 does not have to be provided over the base substrate 120, and the surface of the oxide film 132 provided on the single crystal semiconductor substrate 100 and the surface of the base substrate 120 may be bonded to each other. In this case, a step of providing the nitrogen-containing layer can be omitted.

Note that the structure described in this embodiment can be combined with structures in another embodiment in this specification, as appropriate.

Embodiment 4

In this embodiment, a method for manufacturing a semiconductor device using the SOI substrate which is manufactured according to any of the above embodiments is described.

First, a method for manufacturing an n-channel thin film transistor and a p-channel thin film transistor is described with reference to FIGS. 4A to 4D and FIGS. 5A to 5C. Various kinds of semiconductor devices can be formed by combining a plurality of thin film transistors (TFTs).

In this embodiment, the case where the SOI substrate manufactured through the steps in FIGS. 1A-1 to 1A-3, 1B, 1C, and 1D is used as an SOI substrate is described. It is needless to say that the SOI substrate manufactured by the method described in any of the above embodiments can also be used.

Figure 4A:
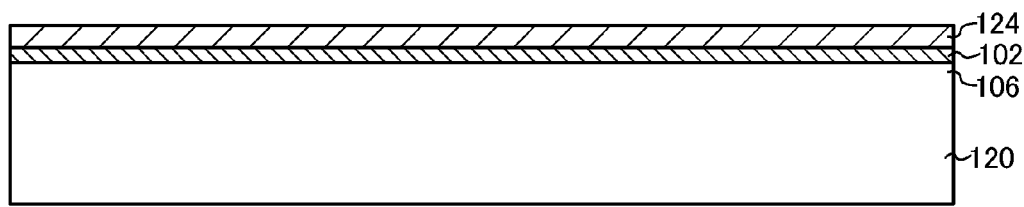
FIGS. 4A to 4D are diagrams illustrating an example of a method for manufacturing an SOI substrate.

FIG. 4A is a cross-sectional view of an SOI substrate manufactured using the method described with reference to FIGS. 1A-1 to 1A-3, 1B, 1C, and 1D.

Figure 4B:
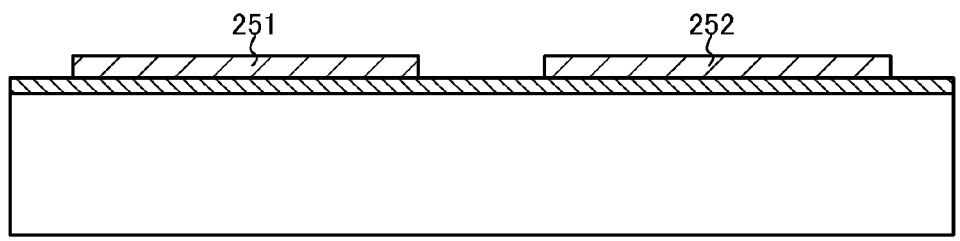

First, the single crystal semiconductor layer 124 is separated into each element by etching to form semiconductor layers 251 and 252 as illustrated in FIG. 4B. The semiconductor layer 251 is used for an n-channel TFT, and the semiconductor layer 252 is used for a p-channel TFT.

Figure 4C:
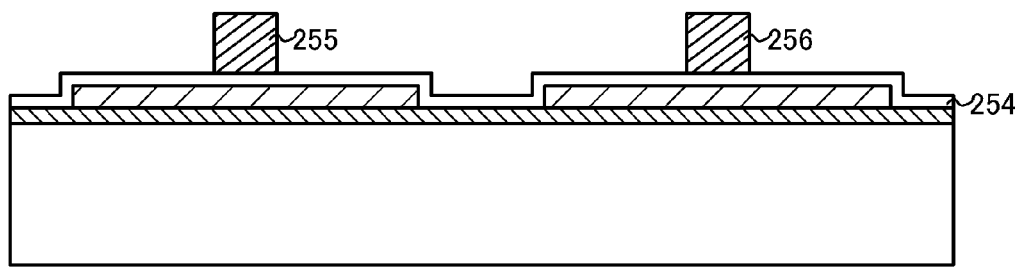

As illustrated in FIG. 4C, an insulating film 254 is formed over the semiconductor layers 251 and 252. Next, a gate electrode 255 is formed over the semiconductor layer 251 with the insulating film 254 interposed therebetween, and a gate electrode 256 is formed over the semiconductor layer 252 with the insulating film 254 interposed therebetween.

Note that, before the single crystal semiconductor layer 124 is etched, it is preferable to add an impurity element such as boron, aluminum, or gallium or an impurity element such as phosphorus or arsenic to the single crystal semiconductor layer 124 in order to control the threshold voltage of TFTs. For example, an impurity element is added to a region where an n-channel TFT is to be formed, and an impurity element is added to a region where a p-channel TFT is to be formed.

Figure 4D:
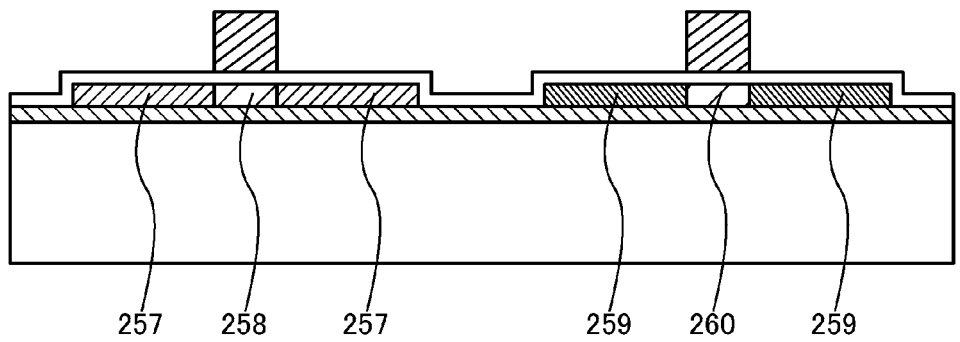

Next, as illustrated in FIG. 4D, n-type low-concentration impurity regions 257 are formed in the semiconductor layer 251, and p-type high-concentration impurity regions 259 are formed in the semiconductor layer 252. Specifically, first, the n-type low-concentration impurity regions 257 are formed in the semiconductor layer 251. In order to form the n-type low-concentration impurity regions 257, the semiconductor layer 252 where a p-channel TFT is to be formed is covered with a resist mask, and an impurity element is added to the semiconductor layer 251. As the impurity element, phosphorus or arsenic may be added. When the impurity element is added by an ion doping method or an ion implantation method, the gate electrode 255 serves as a mask, and the n-type low-concentration impurity regions 257 are formed in the semiconductor layer 251 in a self-aligned manner. A region of the semiconductor layer 251 that overlaps with the gate electrode 255 serves as a channel formation region 258.

Next, after the mask which covers the semiconductor layer 252 is removed, the semiconductor layer 251 where an n-channel TFT is to be formed is covered with a resist mask. Then, an impurity element is added to the semiconductor layer 252 by an ion doping method or an ion implantation method. As the impurity element, boron can be added. In the step of adding the impurity element, the gate electrode 256 serves as a mask, and the p-type high-concentration impurity regions 259 are formed in the semiconductor layer 252 in a self-aligned manner. The high-concentration impurity regions 259 function as a source region and a drain region. A region of the semiconductor layer 252 that overlaps with the gate electrode 256 serves as a channel formation region 260. Here, the method is described in which the p-type high-concentration impurity regions 259 are formed after the n-type low-concentration impurity regions 257 are formed; however, the p-type high-concentration impurity regions 259 can be formed first.

Figure 5A:
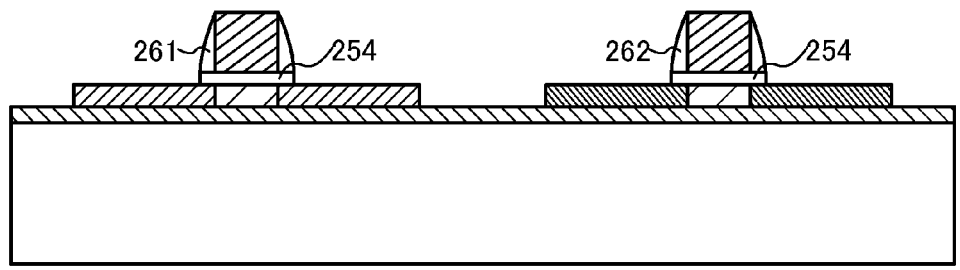
FIGS. 5A to 5C are diagrams illustrating an example of a method for manufacturing an SOI substrate.

Next, after the resist mask that covers the semiconductor layer 251 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 261 and 262 are formed in contact with side surfaces of the gate electrodes 255 and 256 respectively, as illustrated in FIG. 5A. By this anisotropic etching, the insulating film 254 is also etched.

Figure 5B:
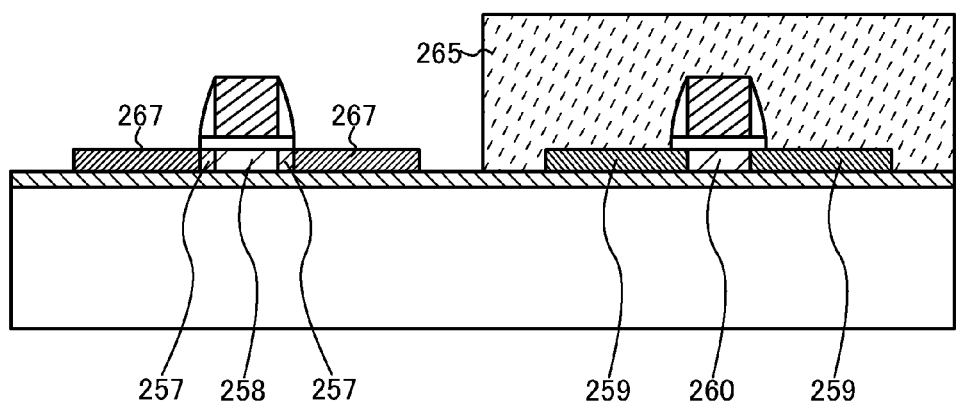

Next, as illustrated in FIG. 5B, the semiconductor layer 252 is covered with a resist 265. In order to form high-concentration impurity regions functioning as a source region and a drain region in the semiconductor layer 251, an impurity element is added to the semiconductor layer 251 at high dose by an ion implantation method or an ion doping method. The gate electrode 255 and the sidewall insulating film 261 function as a mask, and n-type high-concentration impurity regions 267 are formed. Next, heat treatment for activating the impurity element is performed.

Figure 5C:
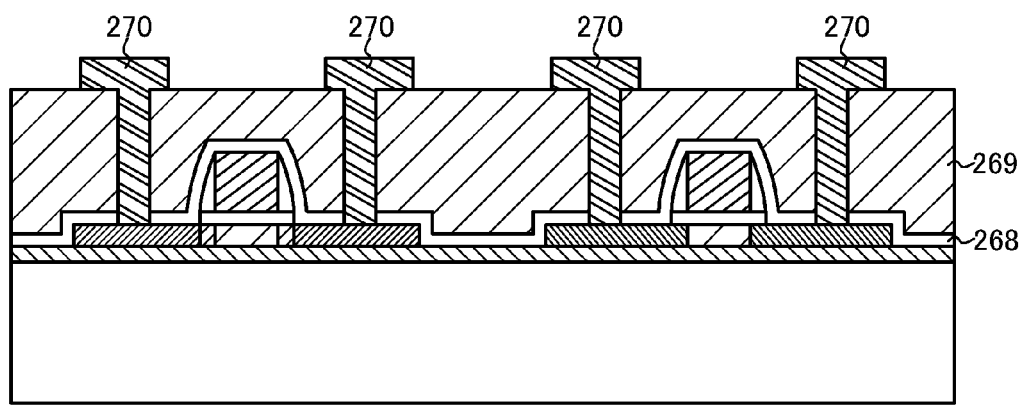

After the heat treatment for activation, an insulating film 268 containing hydrogen is formed as illustrated in FIG. 5C. After the insulating film 268 is formed, heat treatment is performed at a temperature of 350° C. to 450° C. so that hydrogen contained in the insulating film 268 diffuses into the semiconductor layers 251 and 252. The insulating film 268 can be formed by deposition of silicon nitride or silicon nitride oxide by a plasma CVD method at a process temperature of 350° C. or lower. By supply of hydrogen to the semiconductor layers 251 and 252, defects to serve as trapping centers in the semiconductor layers 251 and 252 and at the interface with the insulating film 254 can be repaired effectively.

After that, an interlayer insulating film 269 is formed. The interlayer insulating film 269 can be formed with a film having a single layer structure or a stacked layer structure selected from insulating films of inorganic materials, such as a silicon oxide film and a borophosphosilicate glass (BPSG) film, and organic resin films of polyimide, acrylic, and the like. Contact holes are formed in the interlayer insulating film 269, and wirings 270 are then formed as illustrated in FIG. 5C. The wirings 270 can be formed with a conductive film with a three-layer structure in which a low-resistance metal film such as an aluminum film or an aluminum-alloy film is sandwiched between barrier metal films. The barrier metal films can each be formed using a metal film of molybdenum, chromium, titanium, or the like.

Through the steps described above, a semiconductor device having the n-channel TFT and the p-channel TFT can be manufactured. Because the oxygen concentration of the semiconductor layers in which the channel formation regions are formed is reduced in the manufacturing process of the SOI substrate, TFTs with small off current and suppressed threshold voltage variation can be manufactured. The oxygen concentration in the semiconductor layers in which the channel formation regions are formed is desirably set at lower than $1\times10^{18}$ atoms/cm$^3$, preferably lower than $5\times10^{17}$ atoms/cm$^3$.

Although the method for manufacturing TFTs is described with reference to FIGS. 4A to 4D and FIGS. 5A to 5C, a semiconductor device with high added value can be manufactured by forming a variety of semiconductor elements such as a capacitor or a resistor as well as a TFT. Hereinafter, specific modes of semiconductor devices will be described with reference to the drawings.

Figure 6:
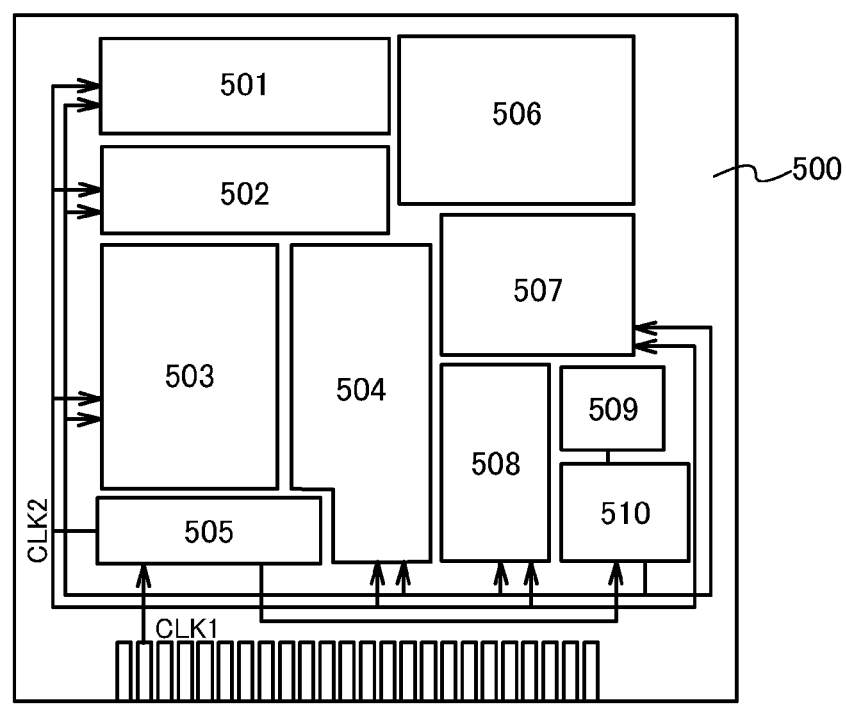
FIG. 6 is a diagram illustrating an example of a semiconductor device using an SOI substrate.

First, a microprocessor is described as an example of semiconductor devices. FIG. 6 is a block diagram illustrating an example of a structure of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 6, the internal clock signal CLK2 is input to other circuits.

Figure 7:
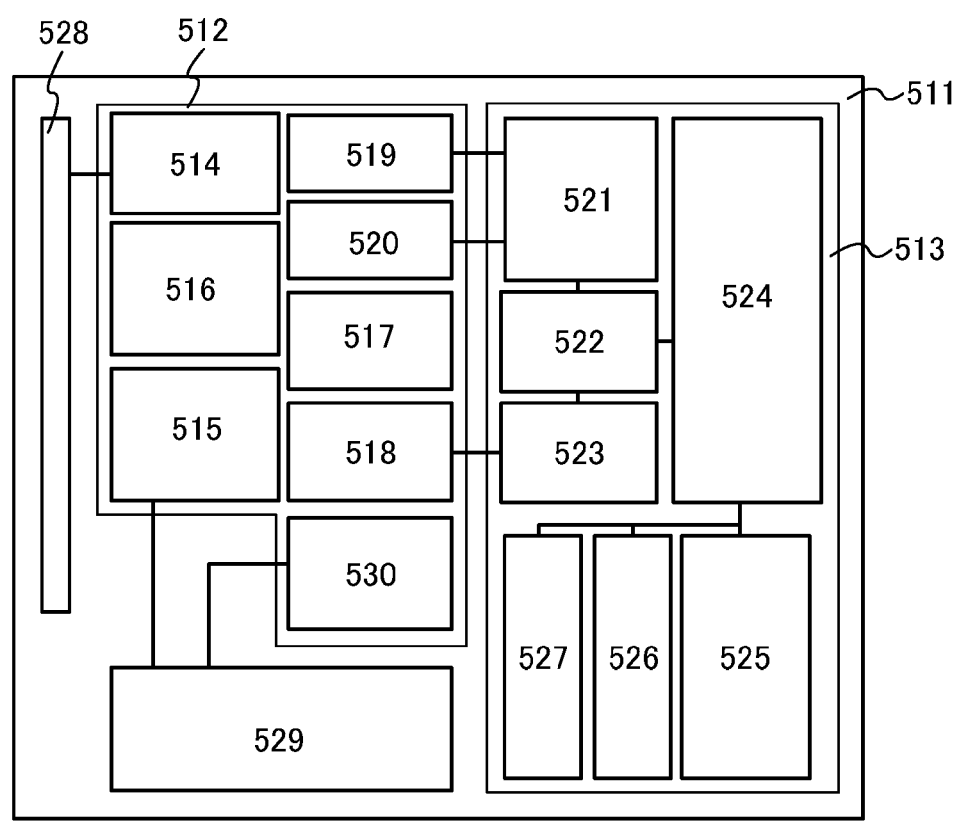
FIG. 7 is a diagram illustrating an example of a semiconductor device using an SOI substrate.

Next, an example of a semiconductor device having an arithmetic function and a contactless data transmission and reception function is described. FIG. 7 is a block diagram illustrating an example of a structure of such a semiconductor device. A semiconductor device illustrated in FIG. 7 can be called a computer that operates to transmit and receive signals to and from an external device by wireless communication (such a computer is hereinafter referred to as an "RFCPU").

As illustrated in FIG. 7, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 has an RF interface 521, a control register 522, a clock controller 523, an interface 524, a central processing unit 525, a random-access memory 526, and a read-only memory 527.

The operation of the RFCPU 511 is roughly as follows. The resonance circuit 514 generates an induced electromotive force based on a signal received by an antenna 528. The induced electromotive force is stored in a capacitor portion 529 through the rectifier circuit 515. This capacitor portion 529 is preferably formed with a capacitor such as a ceramic capacitor or an electric double layer capacitor. The capacitor portion 529 does not need to be formed over a substrate included in the RFCPU 511 and can be incorporated in the RFCPU 511 as a separate component.

The reset circuit 517 generates a signal for resetting and initializing the digital circuit portion 513. For example, the reset circuit 517 generates a signal which rises after rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed with a low-pass filter and binarizes a received amplitude-modulated (ASK) signal based on its amplitude. In order to vary the amplitude of an amplitude-modulated (ASK) transmission signal and transmit the signal, the modulator circuit 520 changes the amplitude of a communication signal by changing a resonance point of the resonance circuit 514.

The clock controller 523 generates a control signal for changing the frequency and duty ratio of a clock signal in accordance with the power supply voltage or consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the interface 524. The interface 524 functions to generate an access signal for any of the read-only memory 527, the random-access memory 526, and the control register 522 based on an address the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices are described with reference to FIGS. 8A and 8B and FIGS. 9A and 9B.

Figure 8A:
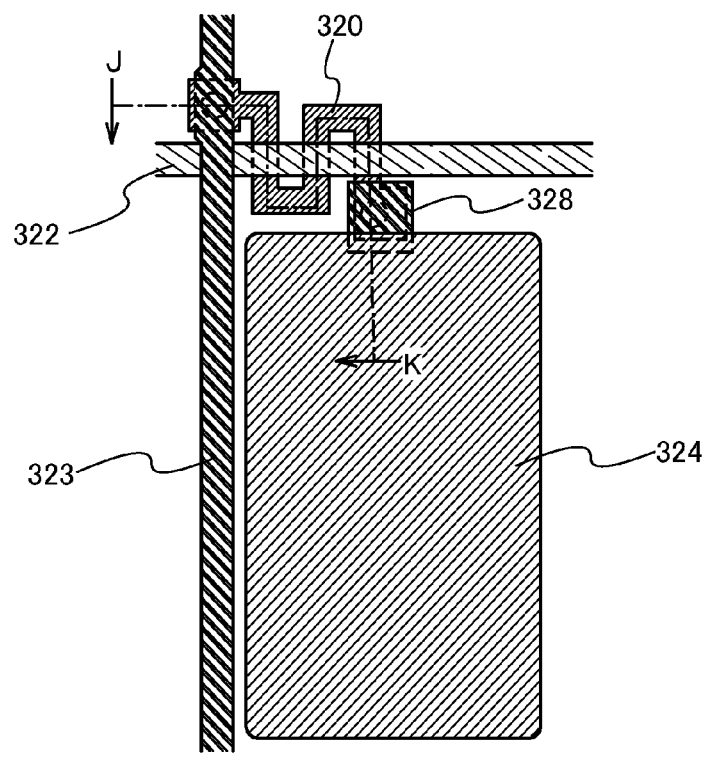
FIGS. 8A and 8B are diagrams illustrating an example of a display device using an SOI substrate.
Figure 8B:
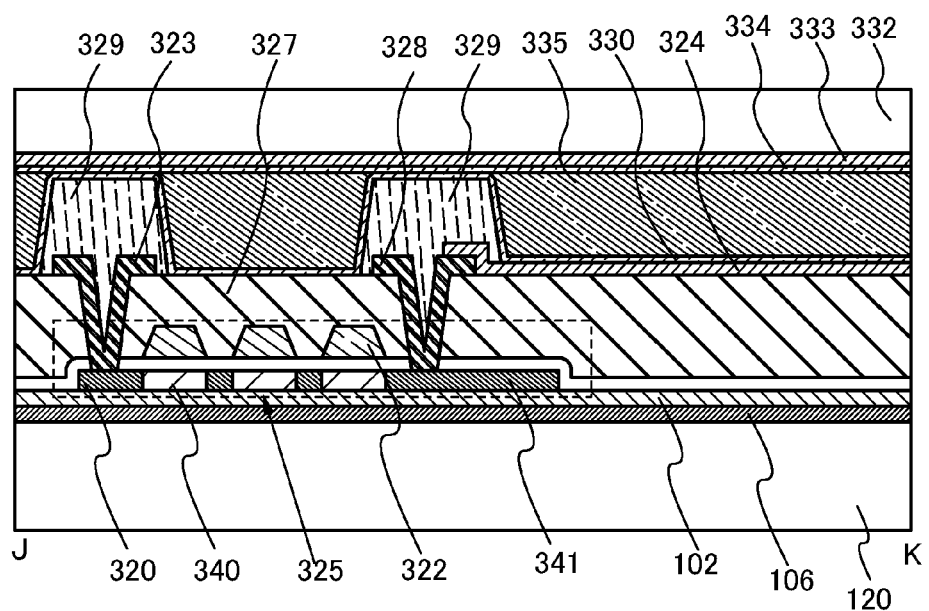

FIGS. 8A and 8B are drawings for describing a liquid crystal display device. FIG. 8A is a plan view of a pixel of the liquid crystal display device, and FIG. 8B is a cross-sectional view taken along a section line J-K in FIG. 8A.

As illustrated in FIG. 8A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer formed of the single crystal semiconductor layer provided over the base substrate 120 and is included in a TFT 325 of the pixel.

As an SOI substrate, the SOI substrate described in any of the embodiments is used. As illustrated in FIG. 8B, the single crystal semiconductor layer 320 is stacked over the base substrate 120 with the oxide film 132 and the nitrogen-containing layer 121 interposed therebetween. As the base substrate 120, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 that covers the counter electrode 333 are formed. The columnar spacers 329 are formed to maintain a space between the base substrate 120 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal.

Figure 9A:
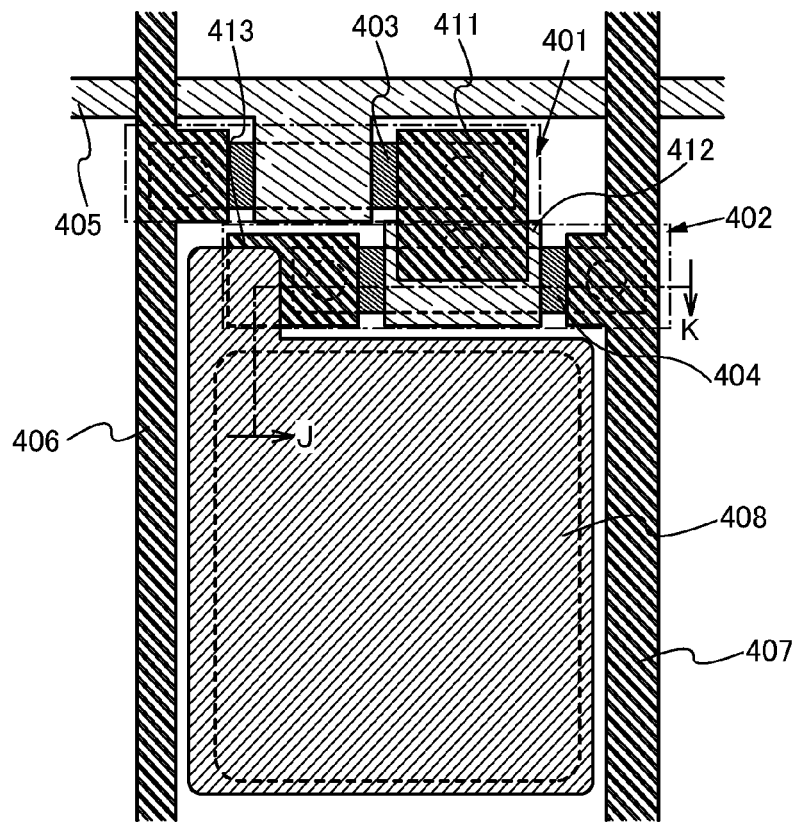
FIGS. 9A and 9B are diagrams illustrating an example of a display device using an SOI substrate.
Figure 9B:
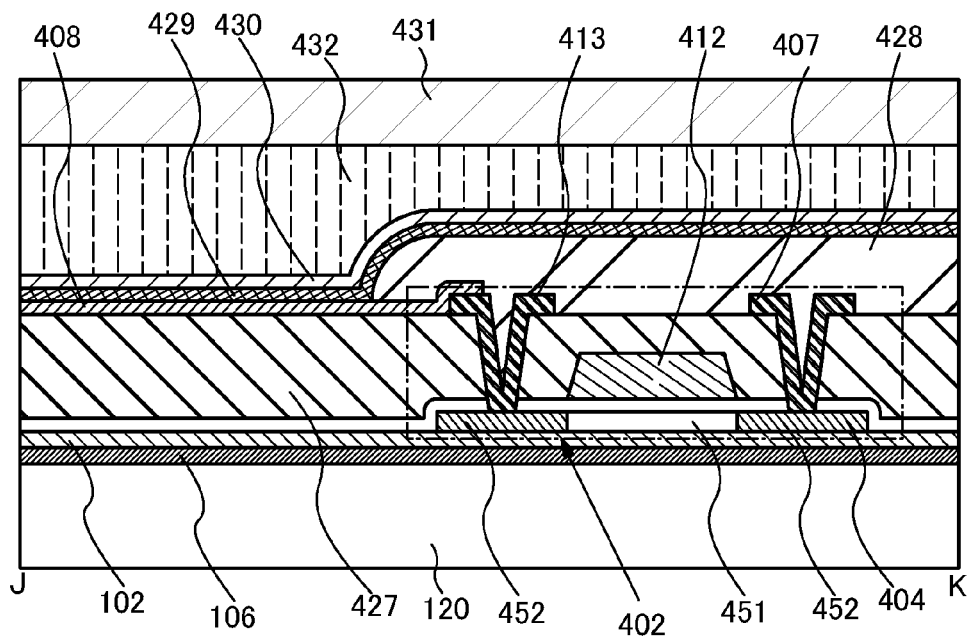

Next, an electroluminescent display device (hereinafter referred to as an "EL display device") is described with reference to FIGS. 9A and 9B. FIG. 9A is a plan view of a pixel of the EL display device, and FIG. 9B is a cross-sectional view taken along a section line J-K in FIG. 9A.

As illustrated in FIG. 9A, the pixel includes a selecting transistor 401 and a display control transistor 402 that are TFTs, a scan line 405, a signal line 406, a current supply line 407, and a pixel electrode 408. Each pixel is provided with a light-emitting element having a structure in which a layer containing an electroluminescent material (EL layer) is interposed between a pair of electrodes. One of the electrodes of the light-emitting element is the pixel electrode 408. In a semiconductor layer 403, a channel formation region, a source region, and a drain region of the selecting transistor 401 are formed. In a semiconductor layer 404, a channel formation region, a source region, and a drain region of the display control transistor 402 are formed. The semiconductor layers 403 and 404 are formed of a single crystal semiconductor layer 124 that is provided over the base substrate.

In the selecting transistor 401, a gate electrode is included in the scan line 405; one of a source electrode and a drain electrode is included in the signal line 406; and the other is formed as an electrode 411. In the display control transistor 402, a gate electrode 412 is electrically connected to the electrode 411; one of a source electrode and a drain electrode is formed as an electrode 413 that is electrically connected to the pixel electrode 408; and the other is included in the current supply line 407.

The display control transistor 402 is a p-channel TFT. As illustrated in FIG. 9B, in the semiconductor layer 404, a channel formation region 451 and p-type high-concentration impurity regions 452 are formed. Note that, as the SOI substrate, the SOI substrate manufactured in any of the embodiments is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the base substrate 120 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to employ when transistors have characteristics which are largely different between pixels, and therefore, a compensation circuit for compensating variation in characteristics is needed. When the EL display device is manufactured by a manufacturing method including a manufacturing process of an SOI substrate, the selecting transistor 401 and the display control transistor 402 do not have variation in electrical characteristics from pixel to pixel. Accordingly, the current drive method can be employed.

That is, various electronic devices can be manufactured by using SOI substrates. Examples of electronic devices include: cameras such as video cameras and digital cameras; navigation systems; sound reproduction devices (car audio systems, audio components, and the like); computers; game machines; portable information terminals (mobile computers, cellular phones, portable game machines, electronic book readers, and the like); image reproduction devices provided with recording media (specifically, devices that are each capable of reproducing audio data stored in a recording medium such as a digital versatile disc (DVD) and that each have a display device capable of displaying image data stored therein); and the like. An example of them is illustrated in FIGS. 10A to 10C.

Figure 10A:
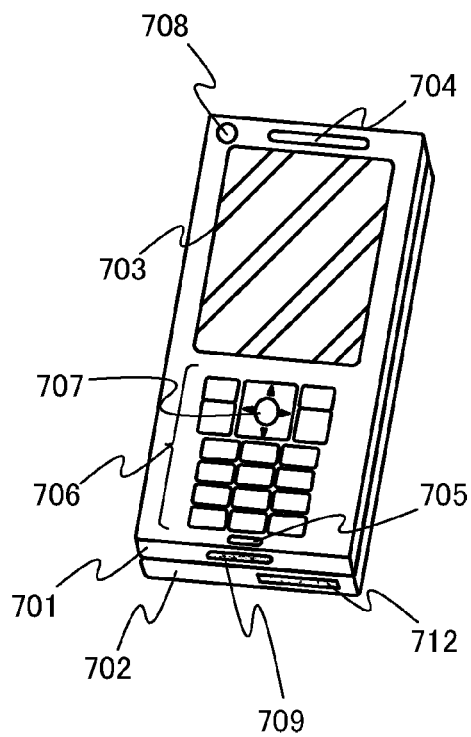
FIGS. 10A to 10C are diagrams illustrating an example of a usage mode in which an SOI substrate is used.
Figure 10B:
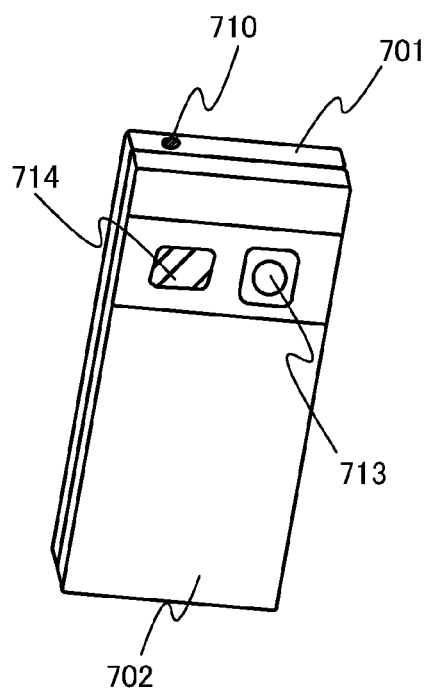
Figure 10C:
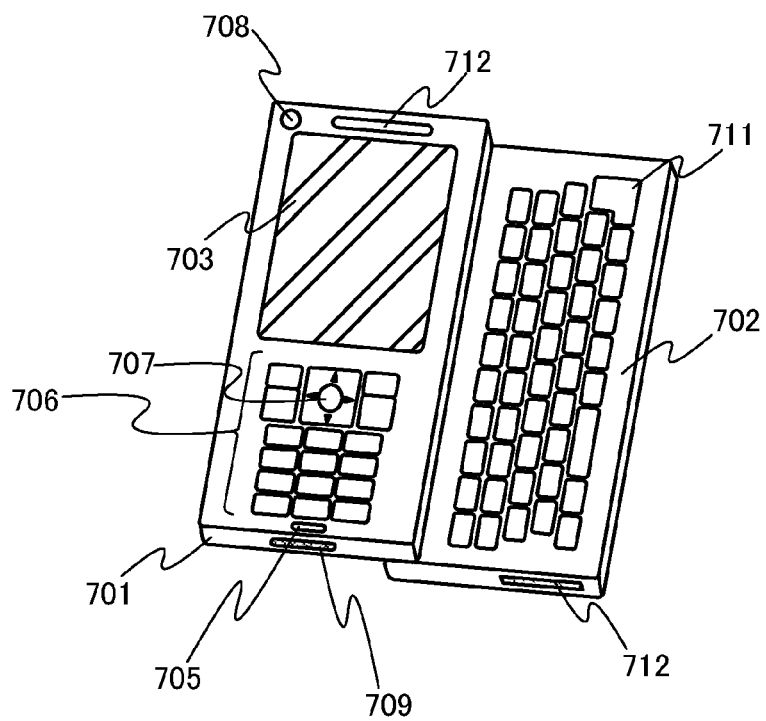

FIGS. 10A to 10C illustrate an example of a cellular phone to which an SOI substrate is applied. FIG. 10A is a front view; FIG. 10B, a rear view; and FIG. 10C, a front view in which two housings are slid. The cellular phone in FIGS. 10A to 10C has two housings, a housing 701 and a housing 702. The cellular phone in FIGS. 10A to 10C is a so-called smartphone that has both a function as a cellular phone and a function as a portable information terminal and incorporates a computer provided to conduct a variety of data processing besides voice calls.

The cellular phone in FIGS. 10A to 10C has the housings 701 and 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

Further, in addition to the above components, the cellular phone in FIGS. 10A to 10C may incorporate a contactless IC chip, a small size memory device, or the like.

The housings 701 and 702 which are put together to be lapped with each other (illustrated in FIG. 10A) can be developed by sliding as illustrated in FIG. 10C. The display portion 703 can incorporate a display panel or a display device to which the method for manufacturing the display device described in Embodiment 2 or 3 is applied. Because the display portion 703 and the front-face camera lens 708 are provided in the same plane, the cellular phone can be used as a videophone. In addition, still images and moving images can be taken with the rear-face camera 713 and the light 714 by using the display portion 703 as a viewfinder.

With the use of the speaker 704 and the microphone 705, the cellular phone in FIGS. 10A to 10C can be used as a sound recording device (recorder) or a sound reproducing device. By operation with the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled in documentation, a use as a portable information terminal, and the like, the use of the keyboard 711 is convenient. The housings 701 and 702 which are put together to be lapped with each other (FIG. 10A) can be developed by sliding as illustrated in FIG. 10C. When the cellular phone is used as a portable information terminal, smooth operation can be conducted using the keyboard 711 or the pointing device 707. The external connection terminal jack 709 can be connected to an AC adaptor and various types of cables such as a USB cable, and charging and data communication with a personal computer or the like are possible. Moreover, a recording medium can be inserted into the external memory slot 712 so that a large volume of data can be stored and moved.

The housing 702 is provided with the rear-face camera 713 and the light 714 on the rear face (FIG. 10B), and still images and moving images can be taken using the display portion 703 as a viewfinder.

Furthermore, in addition to the above-described functions, the cellular phone may also have an infrared communication function, a USB port, a television one-segment broadcasting receiving function, a contactless IC chip, an earphone jack, or the like.

The electronic device illustrated in FIGS. 10A to 10C can be manufactured by application of the aforementioned method for manufacturing a transistor and a display device.

Note that the structure described in this embodiment can be combined with structures in another embodiment in this specification, as appropriate.

Example 1

In this example, an effect of suppressing temperature increase of a single crystal semiconductor substrate when the single crystal semiconductor substrate is irradiated with ions was observed. Specifically, each profile of an element derived from added ions in the single crystal semiconductor substrate in the case where irradiation with a predetermined number of ions is performed through one step and the case where irradiation with a predetermined number of ions is performed through a plurality of steps was observed.

First, a single crystal semiconductor substrate was prepared and irradiated with accelerated hydrogen ions to form an embrittled region. Then, the concentration of hydrogen added to the single crystal semiconductor substrate was analyzed.

In order to form the embrittled region, hydrogen ions were added to a single crystal silicon wafer by using an ion doping apparatus. A 100% hydrogen gas was used as a source gas, and a single crystal silicon wafer substrate was irradiated with ions in plasma that is generated by excitation of the hydrogen gas and accelerated by an electric field without mass separation. Accordingly, the embrittled region was formed. In the ion doping apparatus, when the hydrogen gas was excited, three kinds of ion species ($H^+$, $H_2^+$, $H_3^+$) were generated, and all of the ion species are accelerated, with which the single crystal semiconductor substrate was irradiated. Note that approximately 70% of the hydrogen ion species that are generated from the hydrogen gas was $H_3^+$.

As an ion irradiation condition, the condition under which the total number of ions (dose) for irradiation is constant (here, the condition under which the dose is $2.0 \times 10^{16}$ cm$^{-2}$) is selected. For example, in the case where irradiation was performed through one step, the irradiation was performed under the condition where the dose of ions for irradiation was $2.0 \times 10^{16}$ cm$^{-2}$, and in the case where irradiation was performed through two steps, the irradiation was performed through two steps under the condition where the dose of ions for each irradiation was $1.0 \times 10^{16}$ cm$^{-2}$. Similarly, in the case where irradiation was performed through four steps, the irradiation was performed through four steps under the condition where the dose of ions for each irradiation was $5.0 \times 10^{15}$ cm$^{-2}$, and in the case where irradiation was performed through eight steps, the irradiation was performed through eight steps under the condition where the dose of ions for each irradiation was $2.5 \times 10^{15}$ cm$^{-2}$. Further, as a common condition, an acceleration voltage was set to 50 kV, and beam current density was set to 5 µA/cm$^2$.

Note that the hydrogen concentration of the single crystal semiconductor substrates was analyzed using secondary ion mass spectrometry (SIMS).

Figures 11A, 11B:
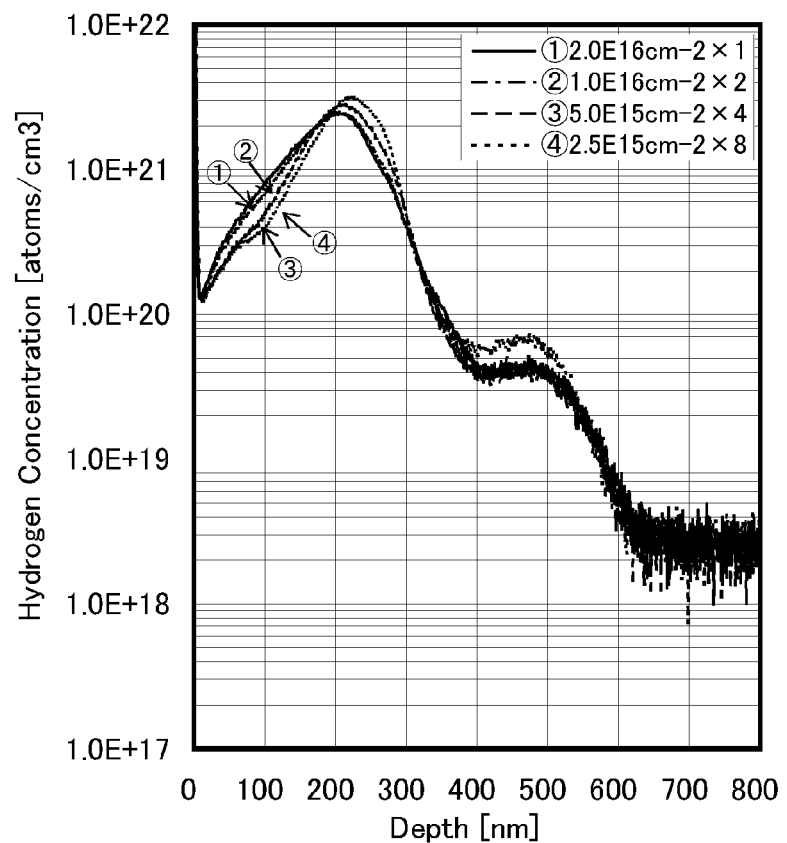
FIGS. 11A and 11B are graphs showing measurement results of hydrogen concentrations in a single crystal semiconductor substrate in the case where the number of times of ion irradiation is changed.

In FIG. 11A, analysis results are shown. As for peaks (the peaks resulting from $H_3^+$ irradiation) present a depth of around 200 nm in the profiles in FIG. 11A, a relationship between a peak position and a peak concentration of each sample is shown in FIG. 11B.

Further, as for the irradiation with the ions, measurement results of the temperature of the single crystal silicon substrate when the dose for each irradiation was changed are shown in Table 1. The temperature of the single crystal silicon substrate was measured using an irreversible thermolabel (manufactured by Thermographic Measurements Ltd (TMC), product name: THERMAX 6 Level Mini Strips) whose portion for indication of temperature changes its color at a specific temperature.

TABLE 1

| dosage [atoms/cm$^2$] | temperature of substrate [° C.] | the number of irradiation |
|---|---|---|
| 5.0E+14 | 54 | 40 |
| 1.0E+15 | 77 | 20 |
| 2.0E+15 | 99 | 10 |
| 3.0E+15 | 116 | |
| 4.0E+15 | 171 | 5 |
| 5.0E+15 | 193 | 4 |
| 6.0E+15 | 224 | |
| 7.0E+15 | 241 | |
| 8.0E+15 | 254 | |
| 9.0E+15 | 224~260 | |
| 1.0E+16 | 254~290 | 2 |
| 1.5E+16 | 290~360 | |
| 2.0E+16 | 290~360 | 1 |

It was confirmed from Table 1 that as the dose of ions for each irradiation was increased (as the time for each irradiation increases), the temperature of the single crystal silicon substrate was increased.

It can be seen from FIGS. 11A and 11B that the peak position is the shallowest and the peak concentration was the lowest in the case where irradiation with the ions was performed through one step. On the other hand, as the number of times of irradiation increases, the peak position becomes deep, and the peak concentration becomes high. It can be seen that the peak position is deeper and the peak concentration is higher in the case where the irradiation was performed through four or more steps as compared to the case where the irradiation was performed through one step. This is because the temperature increase of the substrate is suppressed by increasing the number of times of irradiation (that is, decreasing the dose of ions for each irradiation or providing a cooling period for the substrate).

It can be seen that by suppressing the temperature increase of the single crystal semiconductor substrate, thermal diffusion of the element (here, hydrogen) derived from the added ions is suppressed in the single crystal semiconductor substrate, and a region where hydrogen is added becomes small in a depth direction of the single crystal semiconductor substrate. Further, it can be seen that, by suppressing the temperature increase of the substrate, desorption of hydrogen which is bonded to silicon atoms in the single crystal silicon substrate is reduced, and as a result, remaining hydrogen is increased. In such a manner, a region where an embrittled region is formed becomes small in a depth direction of a single crystal semiconductor substrate, whereby separation of the single crystal semiconductor substrate is favorably performed and a surface of a single crystal semiconductor layer after separation can be planar.

Further, it can be seen from FIGS. 11A and 11B and Table 1 that when the temperature of the single crystal semiconductor substrate in ion irradiation is about 200° C. or lower, an advantageous effect can be sufficiently obtained.

Note that the structure described in this example can be combined with structures in another embodiment in this specification, as appropriate.

This application is based on Japanese Patent Application serial no. 2008-258290 filed with Japan Patent Office on Oct. 3, 2008 and Japanese Patent Application serial no. 2008-258301 filed with Japan Patent Office on Oct. 3, 2008, the entire contents of which are hereby incorporated by reference.

What is claimed is:

1. A method for manufacturing a semiconductor device, comprising:
   irradiating a single crystal semiconductor substrate with accelerated ions to form an embrittled region in the single crystal semiconductor substrate;
   forming an insulating layer over a substrate;

bonding the single crystal semiconductor substrate and the substrate with the insulating layer interposed therebetween; and separating the single crystal semiconductor substrate along the embrittled region to form a single crystal semiconductor layer over the insulating layer, wherein the single crystal semiconductor substrate is cooled while the single crystal semiconductor substrate is irradiated with the accelerated ions.

2. The method for manufacturing a semiconductor device according to claim 1, wherein the single crystal semiconductor substrate is cooled by cooling a substrate supporting base by which the single crystal semiconductor substrate is held.

3. The method for manufacturing a semiconductor device according to claim 2, wherein the substrate supporting base comprises an electrostatic chuck.

4. The method for manufacturing a semiconductor device according to claim 1, wherein ions formed from hydrogen are used as the accelerated ions, and wherein a proportion of $H_3^+$ ions with respect to a total number of the accelerated ions is 70% or more.

5. The method for manufacturing a semiconductor device according to claim 1, wherein a temperature of the single crystal semiconductor substrate when the single crystal semiconductor substrate is irradiated with the accelerated ions is lower than or equal to 200° C.

6. The method for manufacturing a semiconductor device according to claim 1, wherein the substrate is a glass substrate.

7. The method for manufacturing a semiconductor device according to claim 1, wherein the single crystal semiconductor substrate is irradiated with the accelerated ions by an ion doping method.

8. A method for manufacturing a semiconductor device, comprising:

irradiating a single crystal semiconductor substrate with accelerated ions to form an embrittled region in the single crystal semiconductor substrate;

forming an insulating layer over a substrate;

bonding the single crystal semiconductor substrate and the substrate with the insulating layer interposed therebetween; and separating the single crystal semiconductor substrate along the embrittled region to form a single crystal semiconductor layer over the insulating layer, wherein the single crystal semiconductor substrate is swung and cooled while the single crystal semiconductor substrate is irradiated with the accelerated ions.

9. The method for manufacturing a semiconductor device according to claim 8, wherein the single crystal semiconductor substrate is swung by moving a substrate supporting base by which the single crystal semiconductor substrate is held.

10. The method for manufacturing a semiconductor device according to claim 9, wherein the substrate supporting base comprises an electrostatic chuck.

11. The method for manufacturing a semiconductor device according to claim 8, wherein ions formed from hydrogen are used as the accelerated ions, and wherein a proportion of $H_3^+$ ions with respect to a total number of the accelerated ions is 70% or more.

12. The method for manufacturing a semiconductor device according to claim 8, wherein a temperature of the single crystal semiconductor substrate when the single crystal semiconductor substrate is irradiated with the accelerated ions is lower than or equal to 200° C.

13. The method for manufacturing a semiconductor device according to claim 8, wherein the substrate is a glass substrate.

14. The method for manufacturing a semiconductor device according to claim 8, wherein the single crystal semiconductor substrate is irradiated with the accelerated ions by an ion doping method.

15. A method for manufacturing a semiconductor device, comprising:

irradiating a single crystal semiconductor substrate with accelerated ions to form an embrittled region in the single crystal semiconductor substrate;

forming an insulating layer over a substrate;

bonding the single crystal semiconductor substrate and the substrate with the insulating layer interposed therebetween; and separating the single crystal semiconductor substrate along the embrittled region to form a single crystal semiconductor layer over the insulating layer, wherein the single crystal semiconductor substrate is irradiated with the accelerated ions through a plurality of steps, and wherein a temperature of the single crystal semiconductor substrate is decreased after n-th (n is a natural number of 1 or more) irradiation and before (n+1)-th irradiation.

16. The method for manufacturing a semiconductor device according to claim 15, wherein the single crystal semiconductor substrate is cooled while the single crystal semiconductor substrate is irradiated with the accelerated ions.

17. The method for manufacturing a semiconductor device according to claim 15, wherein the single crystal semiconductor substrate is swung while the single crystal semiconductor substrate is irradiated with the accelerated ions.

18. The method for manufacturing a semiconductor device according to claim 15, wherein the single crystal semiconductor substrate is irradiated with the accelerated ions by an ion doping method.

19. The method for manufacturing a semiconductor device according to claim 15, wherein ions formed from hydrogen are used as the accelerated ions, and wherein a proportion of $H_3^+$ ions with respect to a total number of the accelerated ions is 70% or more.

20. The method for manufacturing a semiconductor device according to claim 15, wherein a temperature of the single crystal semiconductor substrate when the single crystal semiconductor substrate is irradiated with the accelerated ions is lower than or equal to 200° C.

21. The method for manufacturing a semiconductor device according to claim 15, wherein the substrate is a glass substrate.

* * * * *